United States Patent
Chang et al.

(10) Patent No.: US 8,791,419 B2
(45) Date of Patent: Jul. 29, 2014

(54) HIGH CHARGE CAPACITY PIXEL ARCHITECTURE, PHOTOELECTRIC CONVERSION APPARATUS, RADIATION IMAGE PICKUP SYSTEM AND METHODS FOR SAME

(75) Inventors: Jeff Hsin Chang, Rochester, NY (US); Timothy J. Tredwell, Fairport, NY (US); Gregory N. Heiler, Hilton, NY (US)

(73) Assignee: Carestream Health, Inc., Rochester, NY (US)

( * ) Notice: Subject to any disclaimer, the term of this patent is extended or adjusted under 35 U.S.C. 154(b) by 541 days.

(21) Appl. No.: 12/968,581

(22) Filed: Dec. 15, 2010

(65) Prior Publication Data

US 2012/0153173 A1 Jun. 21, 2012

(51) Int. Cl.
*G01T 1/24* (2006.01)
(52) U.S. Cl.
USPC ............. 250/370.08; 250/370.09; 250/370.01
(58) Field of Classification Search
USPC ..................... 250/370.08, 370.09, 370.01
See application file for complete search history.

(56) References Cited

U.S. PATENT DOCUMENTS

| | | | |
|---|---|---|---|
| 5,319,206 A | 6/1994 | Lee et al. | |
| 5,895,936 A | 4/1999 | Lee | |
| 6,797,961 B2 | 9/2004 | Choo et al. | |
| 6,806,472 B2 | 10/2004 | Yoon et al. | |
| 6,949,749 B2 | 9/2005 | Tokuda et al. | |
| 7,524,711 B2 | 4/2009 | Lan | |
| 7,601,961 B2 * | 10/2009 | Franklin et al. | 250/370.09 |
| 7,608,832 B2 * | 10/2009 | Okada | 250/370.08 |
| 7,633,091 B2 | 12/2009 | Lan | |
| 7,902,512 B1 * | 3/2011 | Chang et al. | 250/370.01 |
| 7,915,594 B2 * | 3/2011 | Jung | 250/370.09 |
| 2002/0011976 A1 * | 1/2002 | Hashimoto | 345/76 |
| 2007/0211858 A1 * | 9/2007 | Franklin et al. | 378/97 |
| 2008/0036881 A1 * | 2/2008 | Kobayashi | 348/241 |
| 2008/0087835 A1 | 4/2008 | Okada | |
| 2009/0302202 A1 * | 12/2009 | Sato et al. | 250/208.1 |
| 2009/0321643 A1 * | 12/2009 | Rutten et al. | 250/338.4 |
| 2010/0001198 A1 * | 1/2010 | Yagi et al. | 250/370.09 |

OTHER PUBLICATIONS

International Search Report, completed Jun. 27, 2012 for International Application No. PCT/US11/60286, 2 pages.

* cited by examiner

*Primary Examiner* — Christine Sung

(57) ABSTRACT

Embodiments of methods and apparatus are disclosed for obtaining an imaging array or a digital radiographic system including a plurality of pixels where at least one pixel can include a scan line, a bias line, a switching element including a first terminal, a second terminal, and a control electrode where the control electrode is electrically coupled to the scan line; and a photoelectric conversion element including a first terminal electrically coupled to the bias line and a second terminal electrically coupled to the first terminal of the switching element, and a signal storage element formed in the same layers as the scan line, bias line, the data line, the switching element and the photoelectric conversion element. An area of one terminal of the signal storage element can be larger than a surface area of the pixel.

20 Claims, 38 Drawing Sheets

HIGH CHARGE CAPACITY PIXEL ARCHITECTURE, PHOTOELECTRIC CONVERSION APPARATUS, RADIATION IMAGE PICKUP SYSTEM AND METHODS FOR SAME

FIELD OF THE INVENTION

The present invention relates to pixels used in imaging arrays. More specifically, the invention relates to coplanar pixels having relatively high charge capacity and high fill factor suitable for use in visible and X-ray image sensing applications, which can include medical diagnostics, non-destructive inspection, etc.

BACKGROUND OF THE INVENTION

Imaging arrays comprised of multiple sensor pixels 100 are well known in the imaging art. Sensor pixels 100 typically include a switching element 210 such as a thin-film transistor (TFT), and a photoelectric conversion element 220 such as a photodiode. FIG. 1 shows a schematic equivalent pixel circuit for sensor pixels 100. The photoelectric conversion element 220 or photosensor is sensitive to incident radiation and can generate a number of charge carriers where the number depends on the radiation dosage. In imaging arrays composed of a plurality of pixels, the photogenerated carriers are usually temporarily stored across the internal capacitance of the sensor prior to readout. An additional on-pixel storage capacitor 230 can be added to each pixel to increase the pixel's charge capacity, $Q_{pix}$. A task of the switching element 210 is to maintain the signal within the pixel and subsequently enable the readout of the signal. A signal of interest is typically represented by the change in charge carriers held at the floating node 240 of the pixel, which is typically manifested as a potential change of floating node 240. Aside from the device elements 210, 220, 230, the signal lines are also crucial to the functionality of the sensor pixel and the imaging array. The switching element 210 is controlled by the scan line 250 that dictates the time and duration of the signal charge release process. The data line 260 provides a path for the released charge carriers to the readout electronics. The bias line 270 provides the appropriate bias voltages for the photoelectric conversion elements 220.

A plurality of sensor pixels can be tiled in a matrix fashion to form an imaging array. FIG. 2 shows a schematic equivalent diagram of a 3×3 pixels imaging array that can be used for general radiation detection devices. The bias line 270 is shared among pixels in each column and is connected to the sensor bias circuitry. The ground line 340 is shared among pixels in each row parallel to the scan line 250. Lower electrodes 330 (not labeled in FIG. 2) of the on-pixel storage capacitors 230 are connected to the ground lines 340 that provide a common ground reference potential. The data line 260 is shared among pixels in each column and is connected to the readout electronics. The scan line 250 is shared among pixels in each row and is connected to the driving electronics. The driving circuitry provides the appropriate signals on scan lines 250 to release the signals stored on the floating nodes 240 of pixels 100 to the data lines 260 usually one row at a time, usually in sequence.

The incorporation of on-pixel storage capacitor 230 addresses several issues for the related art pixels where most of the signal charge is stored across the internal capacitance of the photoelectric conversion element 220. For one, the addition of an on-pixel storage capacitor 230 helps in boosting the pixel charge capacity $Q_{pix}$. The charge capacity of the pixel dictates the maximum amount of photogenerated signal charge that can be stored in the pixel prior to readout. $Q_{pix}$ can be approximated by $Q_{pix}=C_{pix} \times V_{max}$, where $C_{pix}$ is sum of the internal capacitance of the photoelectric conversion element 220 (hereinafter denoted as $C_{pd}$) and the capacitance of the on-pixel storage capacitor 230 (hereinafter denoted as $C_{st}$), and $V_{max}$ is the maximum potential change allowed under normal operation of the pixel. For related art pixels where the on-pixel storage capacitor 230 does not exist, the magnitude of $C_{pix}$ is dominated by $C_{pd}$. When $V_{max}$ is kept constant, the addition of the on-pixel storage capacitor 230 boosts the magnitude of $C_{pix}$ so that $Q_{pix}$ increases. Boosting the pixel charge capacity may resolve clipping issues in imaging regions subjected to high exposures.

U.S. Pat. No. 7,524,711 discloses one method of fabricating on-pixel storage capacitors 230 for a TFT array backplane used in indirect X-ray sensors. FIGS. 3A-6A illustrates the top-down view of a pixel at various fabrication stages of the TFT array backplane 300. FIGS. 3B-6B illustrates the cross-sectional views of the pixel that corresponds to FIGS. 3A-6A. The cutting-plane line A-A' for the cross-sectional views is shown in top-down view illustrations. Note that the sensor pixel TFT backplane structure 300 shown in FIG. 6A and FIG. 6B does not constitute the entire sensor pixel 100 illustrated in FIG. 1; it merely shows the fabrication steps for a switching element 210 and an on-pixel storage capacitor 230 as disclosed by U.S. Pat. No. 7,524,711.

The manufacturing method of the pixel TFT backplane 300 starts with the deposition of the first metal layer over a substrate 310. The first metal layer is then patterned using photolithography method to produce a gate line 250, a gate electrode 320 for the TFT 210, a lower electrode 330 of the on-pixel storage capacitor 230, and a ground line 340 connecting the lower electrode 330 in each sensor pixel 100. FIG. 3A and FIG. 3B respectively illustrates the top-view and cross-sectional view of the pixel TFT backplane 300 after the first photolithography step. Next, a first insulation layer 410 is deposited on the substrate, the gate line 250, the gate electrode 320, the lower electrode 330, and the ground line 340. A semiconductor layer 420 and a doped layer 430 (not shown in FIG. 4A for clarity) are sequentially formed to cover the substrate 310 and on the insulation layer 410. Next, photolithography is performed to pattern the semiconductor layer and the doped layer to define an island region above the gate electrode 320. FIG. 4A and FIG. 4B illustrates the top-view and cross-sectional view of the resulting structure, respectively. Follows, the second metal layer is deposited to cover the substrate including the island region and the insulation layer 410; photolithography is performed to pattern the second metal layer to form a data line 260, an upper electrode 510, a second electrode 520 connected with the upper electrode 510, a third electrode 530 connected with the data line 260. Accordingly, a gap is also formed removing part of the island region. FIG. 5A and FIG. 5B illustrates the top-view and cross-sectional view of the resulting structure, respectively. The upper electrode 510, lower electrode 330, and portion of the insulator layer 410 in between the two electrodes constitute the on-pixel storage capacitor 230. The gate electrode 320, the second electrode 520, the third electrode 530, the island, and the portion of the insulator layer 410 in between the island and the gate electrode 320 constitutes the TFT switching element 210. Subsequently, a passivation layer 620 is deposited cover the substrate including the second metal layer and the island gap opening. To enable connection between the on-pixel storage capacitor 230 and the photoelectric conversion element 220, a region of the passivation layer 620 is removed using another photolithography step. This aperture region 610 exposes a portion of the upper electrode 510. FIG. 6A and FIG. 6B illustrates the top-view and cross-sectional view of the resulting structure, respectively.

The on-pixel storage capacitor 230 implementation described above as well as those disclosed by U.S. Pat. No. 5,319,206 and U.S. Pat. No. 6,806,472 requires the electrode not connecting to the photoelectric conversion element 220 be biased independently from the photoelectric conversion element 220. The voltage applied to these terminals for each pixel is usually the ground reference potential or common potential as indicated by the pixel schematic diagram shown in FIG. 1. Consequently, the implementation requires additional routing lines to connect the lower electrode 330 in each pixel, such as ground line 340 shown FIGS. 3A-6A. It is generally desirable to reduce the number of routing lines in each pixel since larger routing line count may potentially reduce the manufacturing yield of the image sensor. The on-pixel storage capacitor 230 implementation described previously also places a constraint on the maxim area allowed by the storage capacitor. Referring to FIG. 6A the upper electrode 510 of the on-pixel storage capacitor 230 is deposited simultaneously as the data line 260 and the third electrode 530 of the TFT. Therefore, the upper electrode cannot span beyond those regions occupied by other electrodes, which would otherwise lead to shorting between electrodes. Consequently, the maximum area of the upper electrode 510 in each pixel is restricted to those areas not occupied by the data line 260 and the TFT. Similar statement can be said for the lower electrode of the on-pixel storage capacitor 230 and the scan line 250. Given that the thickness and build material of the insulator layer 410 is unchanged, $C_{st}$ scales proportionally with the electrode area. Therefore, $C_{st}$ is maximized when the area of both upper electrode 510 and lower electrode 330 are made as large as possible within the pixel. Please note that the area of the upper electrode 510 or lower electrode 330 must be smaller than $p^2$, where p is the pixel pitch. This also places an upper limit on the maximum $Q_{pix}$ without having to modify other pixel metrics such as $C_{pd}$.

SUMMARY OF THE INVENTION

Accordingly, it is an aspect of this application to address in whole or in part, at least the foregoing and other deficiencies in the related art.

It is another aspect of this application to provide in whole or in part, at least the advantages described herein.

Another aspect of the application is to provide a method and/or a an apparatus to improve the pixel charge capacity, which can be done so in parallel with the fabrication of a radiographic sensor array, and can prevent or reduce additional costs associated with extra masks and process steps for various types of switching device configurations/types and/or various photoelectric conversion device configurations/types. Another aspect of the application is to provide a method and/or a means of boosting on-pixel storage capacitor without reducing or sacrificing the pixel fill-factor. Yet another aspect of the application is to provide a method and/or apparatus to enable the incorporation of the on-pixel storage capacitor without the requirement of additional routing lines; therefore, to improve manufacturing reliability and/or yield. Yet, another aspect of the application is to provide a method and/or apparatus to boost an area of an on-pixel storage capacitor beyond the constraint of the pixel pitch or dimension, which can be done without additional fabrication steps relative to pixels or sensory arrays (i.e., without on-pixel storage capacitor) fabrication procedures.

Another aspect of the application is to provide a bias line configured to connect to adjacent pixels on at least one side, at least two sides, at least three sides or at each side of the pixel.

In one exemplary embodiment, a pixel can include a scan line proximate to a first surface of a substrate; a bias line between the first surface of the substrate and a first terminal of a photoelectric conversion element, a switching element proximate to the first surface of the substrate and aligned with at least a portion of the scan line, comprising a first terminal; a second terminal; and a gate electrode electrically coupled to the scan line, wherein the first terminal and the second terminal are electrically coupled based on a scan signal from the scan line; a photoelectric conversion element proximate to the first surface of the substrate, comprising the first terminal electrically coupled to the bias line; and a second terminal electrically coupled to the first terminal of the switching element; and a signal storage element proximate to the first surface of the substrate, comprising a first terminal electrically coupled to the bias line; and a second terminal electrically coupled to the first terminal of the switching element and aligned with at least a portion of the photoelectric conversion element; and a dielectric layer in proximate to the first terminal and the second terminal.

In one embodiment, a method of forming a digital radiographic detector including an indirect imaging pixel array can include providing a substrate for the indirect imaging pixel array; forming a scan line, a bias line and a control electrode of a switching element in a first metal layer proximate to a first surface of the substrate; forming a first insulating dielectric layer over the scan line, the control electrode of the switching element and the bias line; forming an island area over at least a portion of the control electrode, the island area comprising a semiconductor layer; forming a second terminal of the switching device, a data line connected to the second terminal of the switching device, a first terminal of the switching device, and a second terminal of a photoelectric conversion device connected to the first terminal of the switching device in a second metal layer proximate to a first surface of the substrate, wherein the first terminal and the second terminal of the switching element are electrically coupled based on a scan signal from the scan line; forming a second insulating dielectric layer over the first terminal of the switching device, the data line and the second terminal of the switching device, wherein the second terminal of the photoelectric conversion device is exposed in the second insulating dielectric layer; forming a photoelectric conversion layer stack over the second terminal of the photoelectric conversion element and a first terminal of the photoelectric conversion element over the photoelectric conversion layer stack in a third metal layer; and electrically connecting the first terminal of the photoelectric conversion element to the bias line, wherein the forming a scan line through electrically connecting steps form a signal storage element proximate to the first surface of the substrate, comprising a first terminal electrically coupled to the bias line; a second terminal electrically coupled to the first terminal of the switching element; and a dielectric layer proximate to the first terminal and the second terminal of the signal storage element.

These objects are given only by way of illustrative example, and such objects may be exemplary of one or more embodiments of the invention. Other desirable objectives and advantages inherently achieved by the disclosed invention may occur or become apparent to those skilled in the art. The invention is defined by the appended claims.

BRIEF DESCRIPTION OF THE DRAWINGS

Various features of the embodiments can be more fully appreciated as the same become better understood with reference to the following detailed description of exemplary embodiments when considered in connection with the accompanying figures.

FIG. 3A to FIG. 6A are diagrams that illustrate the top-down views of the pixel backplane according to one conventional manufacturing process;

FIG. 3B to FIG. 6B are diagrams that illustrates the cross-sectional views of the pixel backplane according to the conventional manufacturing process shown in FIG. 3A to FIG. 6A, respectively;

FIG. 9A to FIG. 16A are diagrams that illustrate top-down views of an exemplary pixel embodiment at various stages of a manufacturing process according to present teachings;

FIG. 9B to FIG. 16B are diagrams that illustrate respective cross-sectional views of the pixel corresponding to FIGS. 9A-16A;

FIG. 19A to FIG. 24A are diagrams that illustrate top-down views of another exemplary pixel embodiment at various stages of a manufacturing process according to present teachings;

FIG. 19B to FIG. 24B are diagrams that illustrate respective cross-sectional views of the pixel corresponding to FIGS. 19A-24A;

FIG. 25A to FIG. 28A are diagrams that illustrate top-down views of yet another exemplary pixel embodiment at various stages of a manufacturing process according to present teachings;

FIG. 25B to FIG. 28B are diagrams that illustrate respective cross-sectional views of the pixel corresponding to FIGS. 25A-28A;

FIG. 29A to FIG. 36A are diagrams that illustrate top-down views of still yet another exemplary pixel embodiment at various stages of a manufacturing process according to present teachings;

FIG. 29B to FIG. 36B are diagrams that illustrate respective cross-sectional views of the pixel corresponding to FIGS. 29A-36A;

DESCRIPTION OF EXEMPLARY EMBODIMENTS

Figure 1:
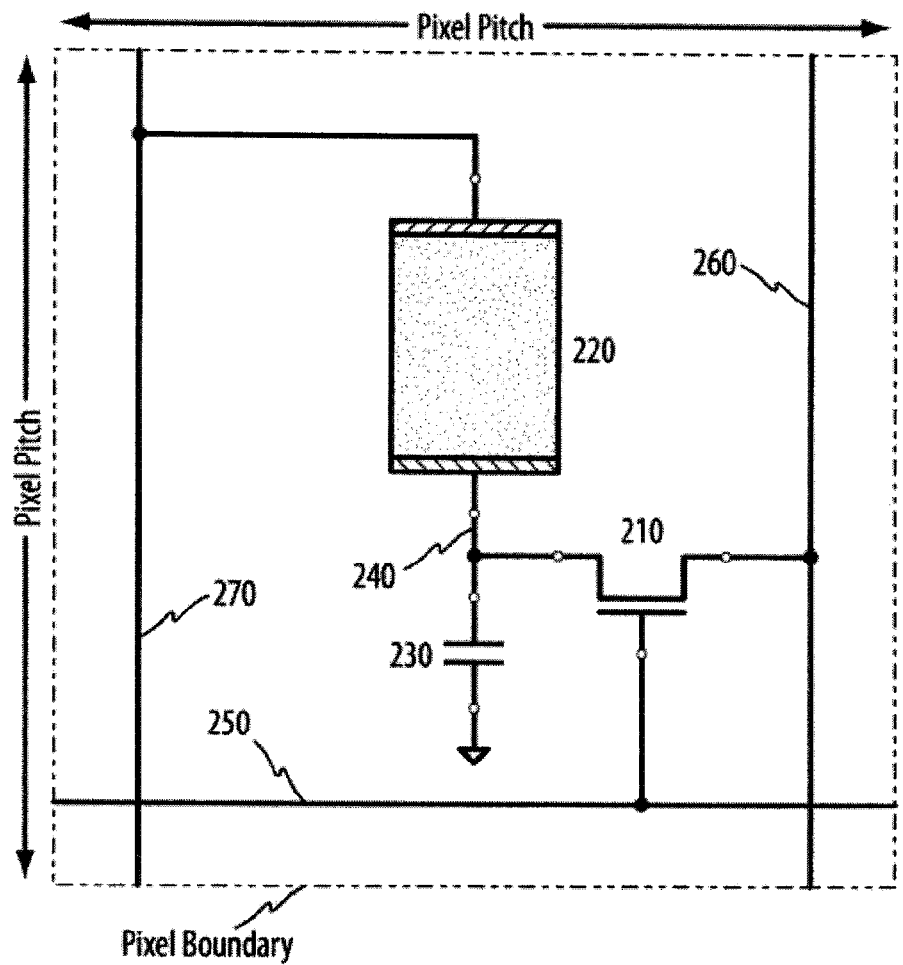
FIG. 1 is a diagram that shows a schematic equivalent circuit for a sensor pixel utilized in known imaging arrays.

Reference will now be made in detail to exemplary embodiments of the application, examples of which are illustrated in the accompanying drawings. Wherever possible, the same reference numbers will be used throughout the drawings to refer to the same or like parts.

For simplicity and illustrative purposes, principles of present teachings are described by referring mainly to exemplary embodiments thereof. However, one of ordinary skill in the art would readily recognize that the same principles are equally applicable to, and can be implemented in, all types of secure distributed environments and that any such variations do not depart from the true spirit and scope of the present application. Moreover, in the following detailed description, references are made to the accompanying figures, which illustrate specific embodiments. Electrical, mechanical, logical and structural changes can be made to such exemplary embodiments without departing from the spirit and scope of the present teachings. The following detailed description is, therefore, not to be taken in a limiting sense and the scope of the present application is defined by the appended claims and their equivalents.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of −2 and the maximum value of 10, that is, any and all sub-ranges having a minimum value equal to or greater than −2 and a maximum value equal to or less than 10, e.g., 1 to 5.

Pitch, as used herein, is defined as the length or repeated spacing of a given element. For example, pixel pitch is used herein to describe the repeating distance between each pixel in an array of pixels. An imaging element or pixel can include at least one transistor/switching element and at least one photodiode/photoelectric conversion element. A photoelectric conversion element converts electromagnetic radiation from at least one portion of the electromagnetic spectrum, (including gamma rays to infrared radiation), into electrical charge. The fill factor is the percentage of the pixel area that is sensitive to incident photons. Also, individual pixels can be electrically coupled to form an imaging array. The term overlap as used herein is defined as the common space that is covered by two elements.

With reference to the manufacturing process discussed, one skilled in the art will understand that the various layers comprising any type of stacked electrical device can each be deposited to form a pattern, e.g., the pattern being defined by a mask (e.g., of previously formed features, lithography, combinations thereof, etc.), deposited as a non-patterned layer, which is then etched (e.g., by a mask), or combinations thereof. These steps are used in various combinations in order to form a final desired structure. Therefore, for purposes of this discussion the use of the term "to form" (in any conjugation) when discussing pixel manufacturing is intended to include the various depositing/etching/masking techniques known in the art.

Examples of metal and metal layer compositions, as used herein, may include, e.g., Al, Cr, Cu, Mo, Nd, Ti, W, etc., metal alloys with partial composition of these elements (e.g., MoW, AlNd, etc.), stacks thereof, etc. Other examples of metal layers may include optically transparent conductive materials such as ITO and IZO.

Figure 7:
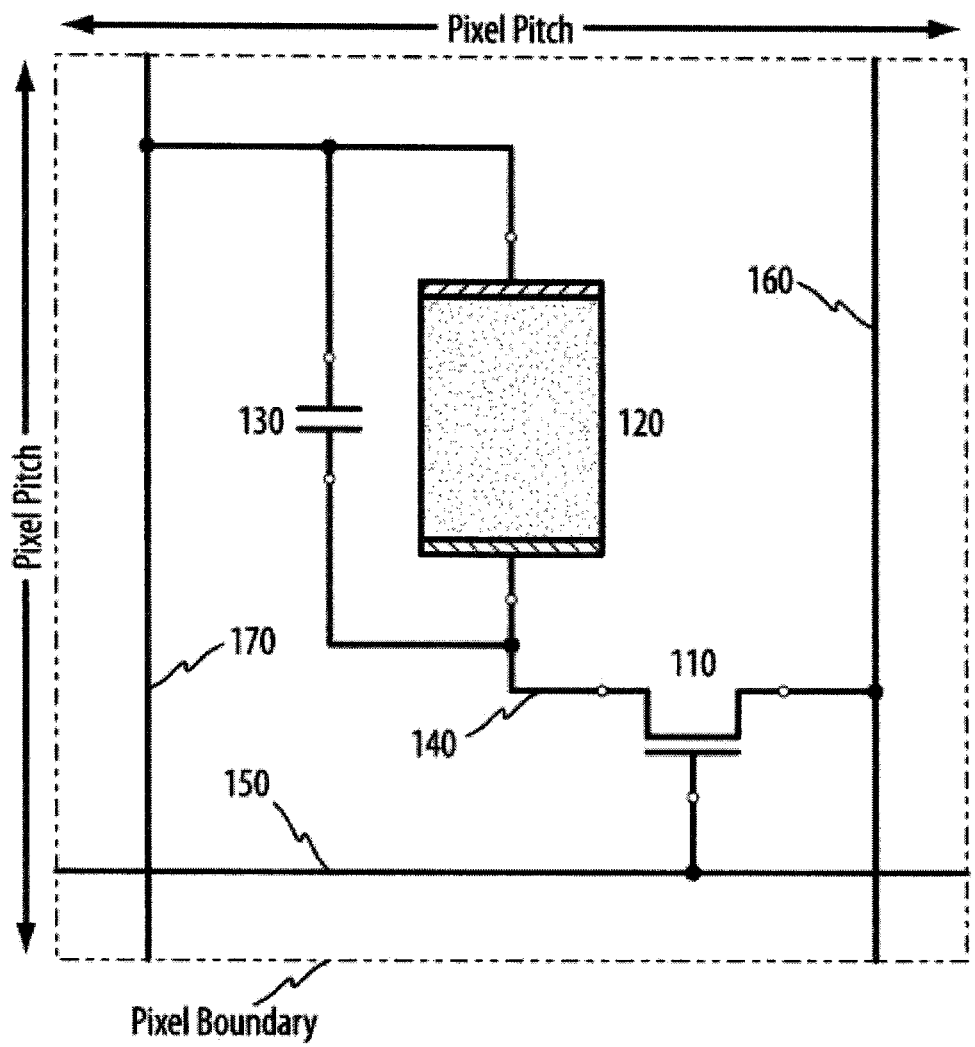
FIG. 7 is a diagram that shows a schematic equivalent circuit for an exemplary sensor pixel embodiment according to present teachings.

FIG. 7 shows a schematic equivalent pixel circuit for an exemplary sensor pixel embodiment according to the present teachings. As shown in FIG. 7, a sensor pixel 700 can include a switching element 110, a photoelectric conversion element 120, and an on-pixel storage capacitor 130. During the photon collection phase of pixel operations, the photoelectric conversion element 120 generates charge carriers based on the number of incident photons. The charge carriers are swept toward the terminals of the photoelectric conversion element 120. The bias line 170 can provide an appropriate bias potential for the photoelectric conversion element 120. The switching element 110 can be placed in high impedance state holding the photogenerated carriers near the floating node 140. A scan line 150 can be used to control the state of the switching element 110. For example, the switching element can be placed in low impedance state allowing the charge carriers held at the floating node 140 to flow onto the data line 160 when the scan line 150 is asserted. The on-pixel storage capacitor 130 can be coupled in parallel to the photoelectric conversion element 120, where one terminal of the storage capacitor 130 can be electrically connected to the floating node 140 and another terminal can be electrically connected to the bias line 170.

As shown in FIG. 7, the sensor pixel 700 is square; however, embodiments according to present teachings are not intended to be so limited. Thus, exemplary pixels 700 can be circular, rectangular or the like and can be formed in a repeatable pattern.

Figure 2:
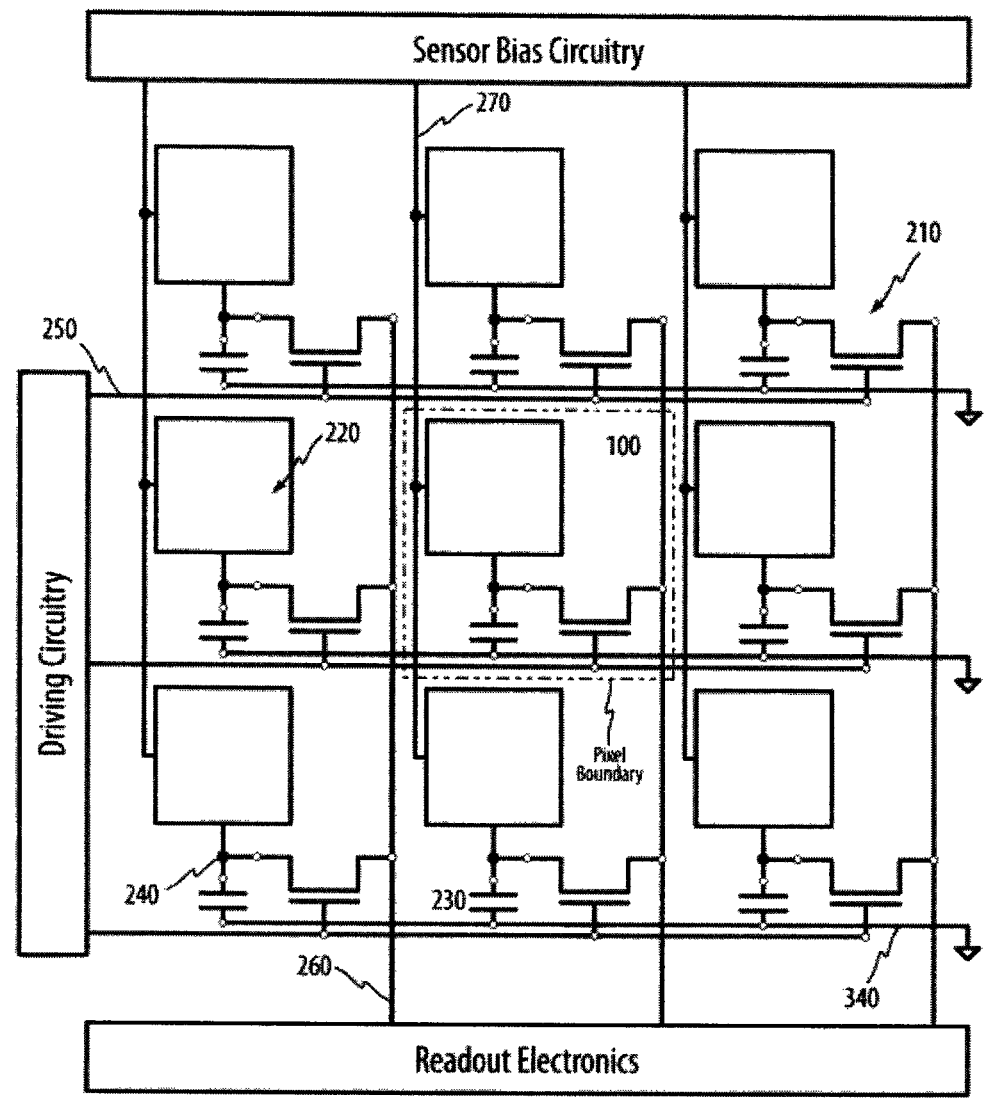
FIG. 2 is a diagram that shows a 3×3 pixel imaging array configuration used for known general radiation detection devices.
Figure 3A:
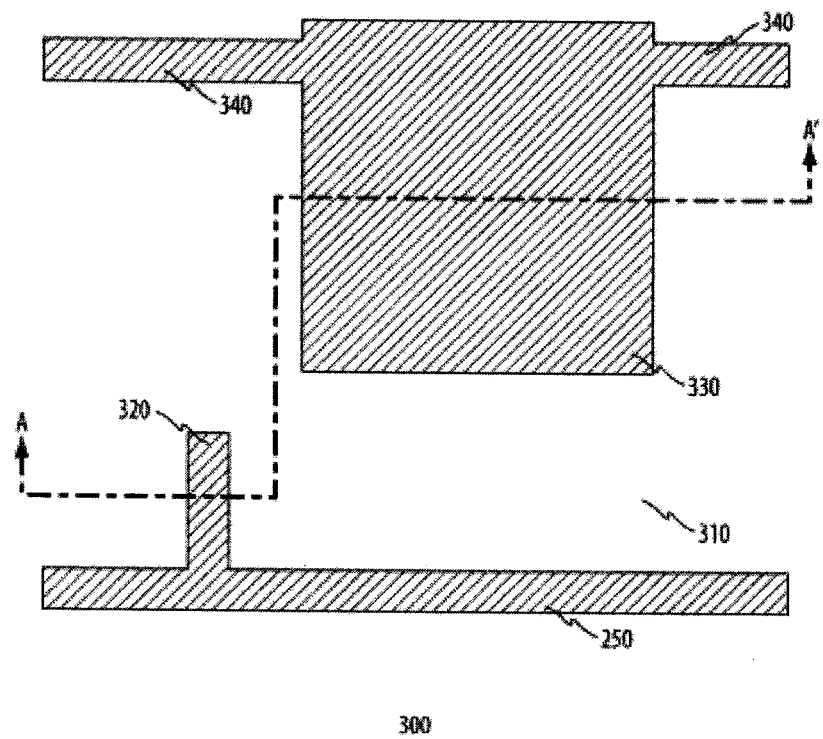
Figure 3B:
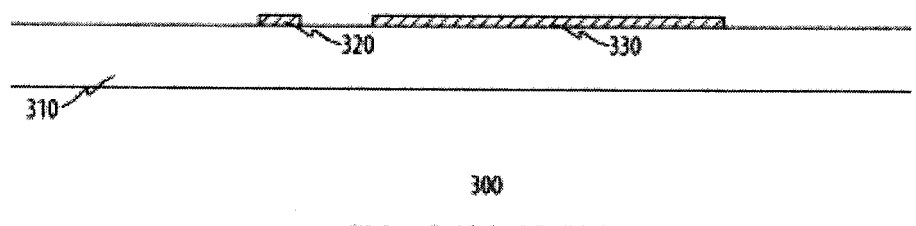
Figure 4A:
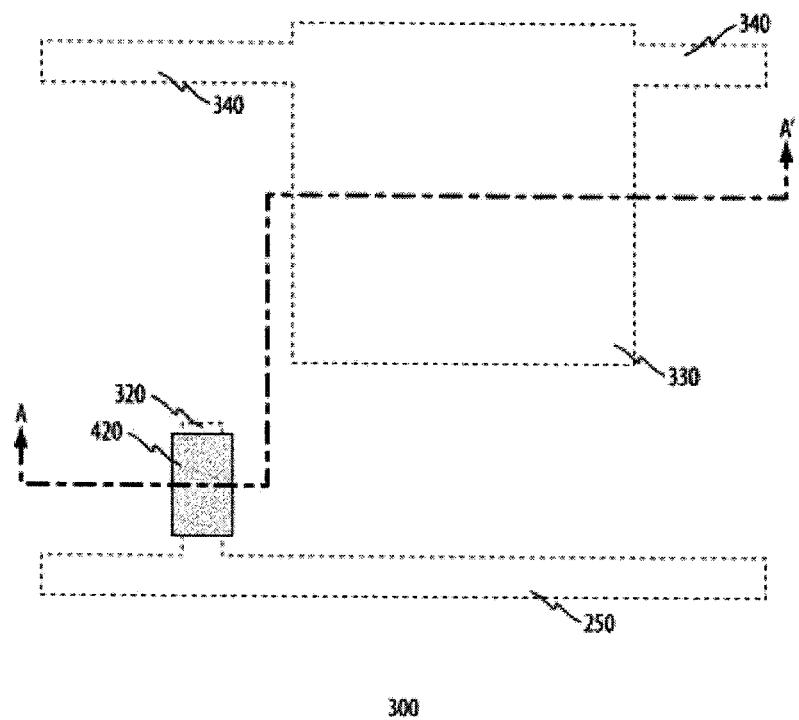
Figure 4B:
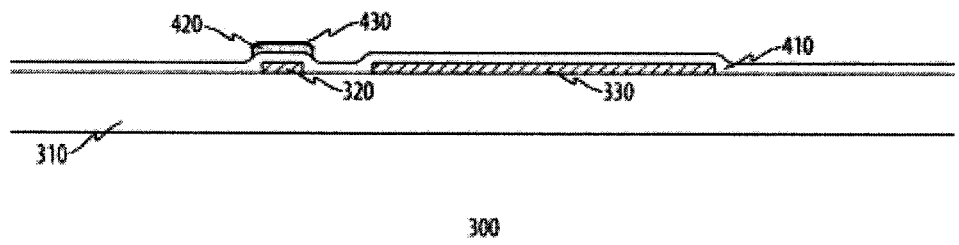
Figure 5A:
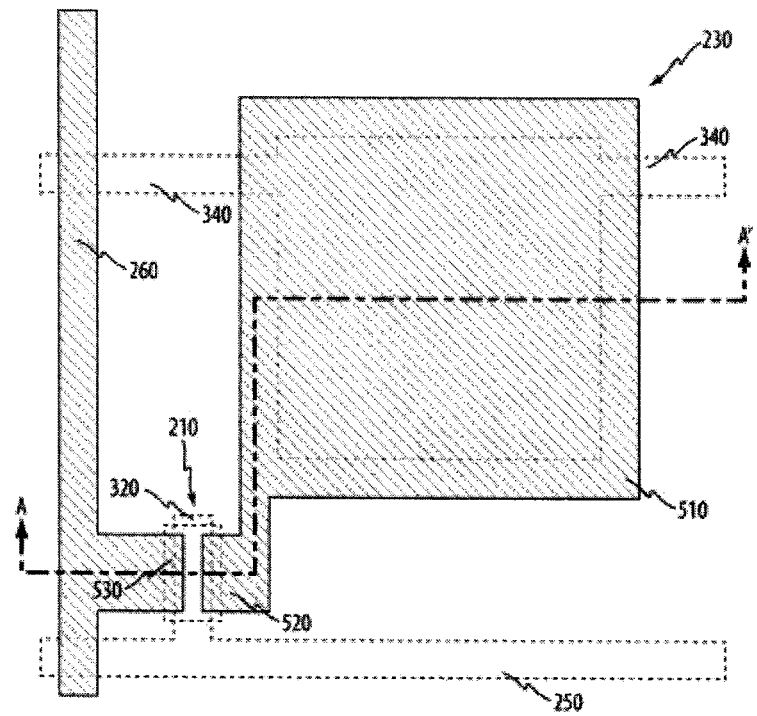
Figure 5B:
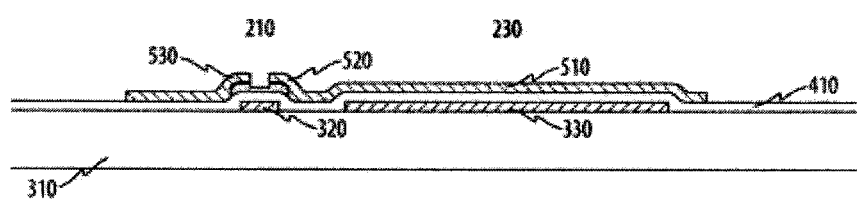
Figure 6A:
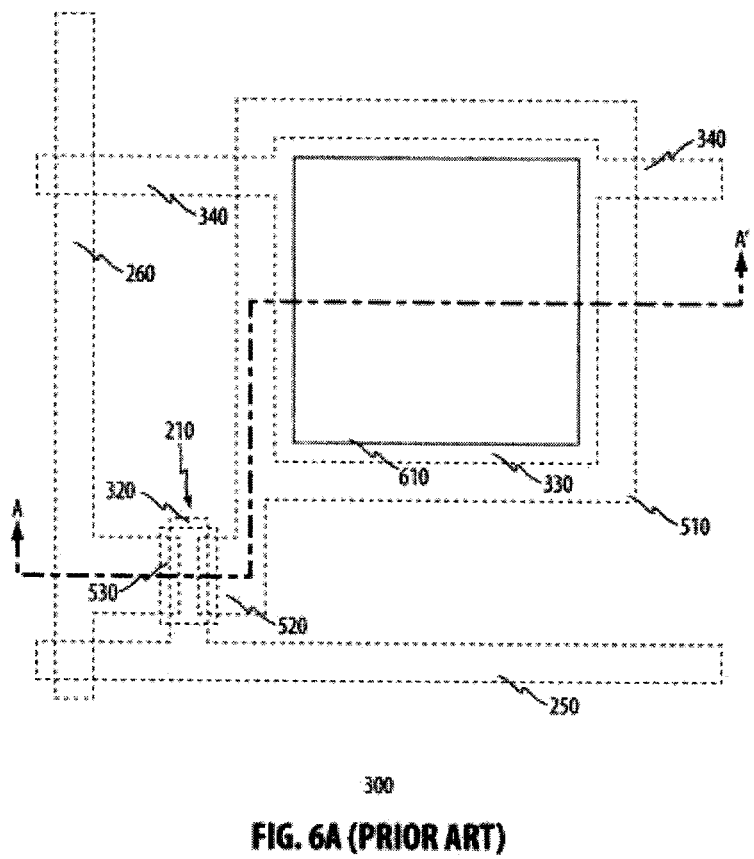
Figure 6B:
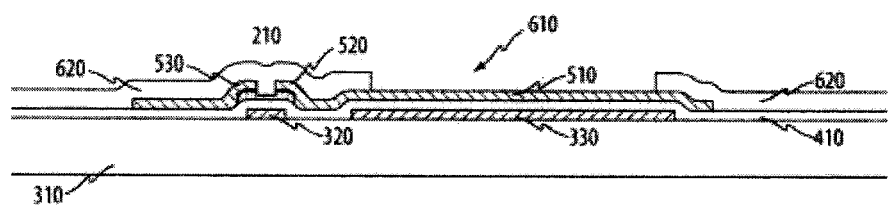
Figure 8:
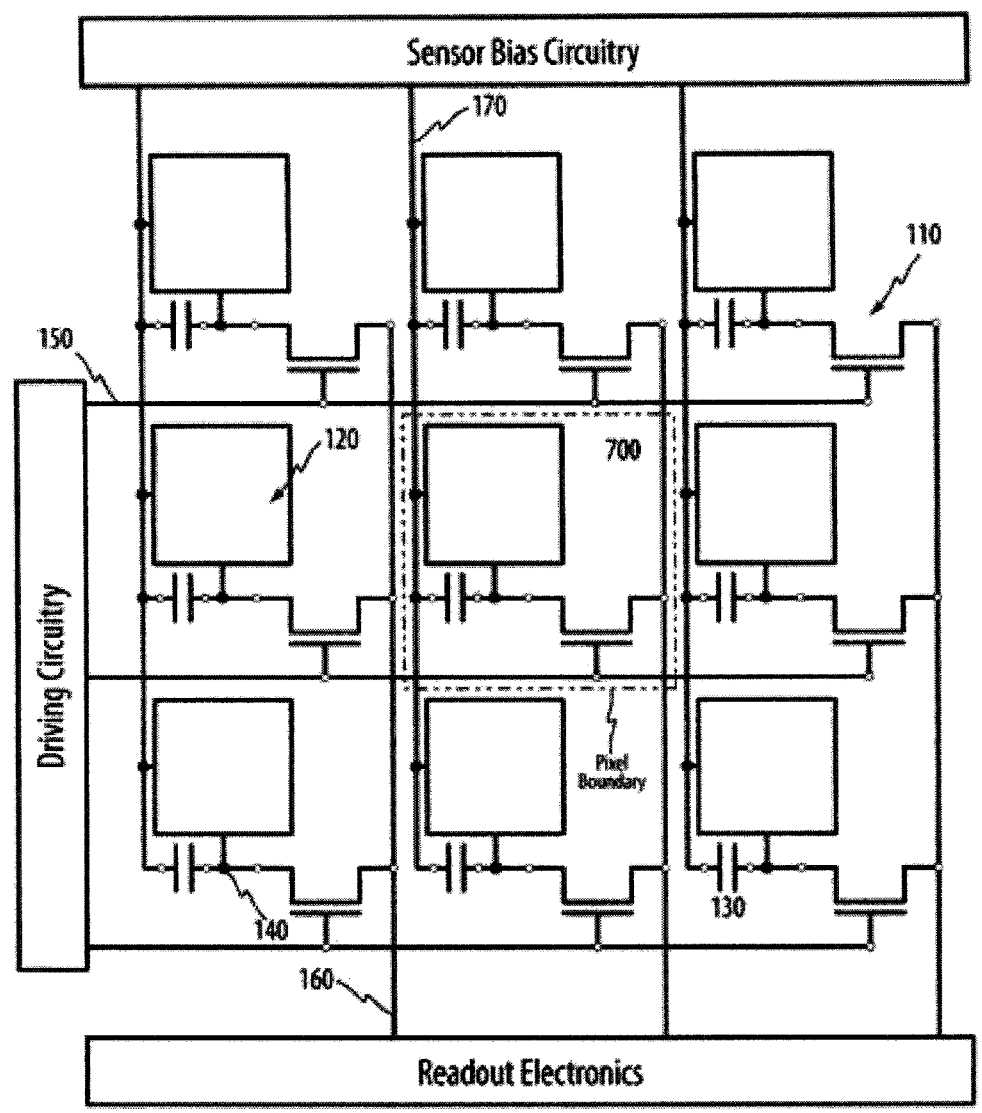
FIG. 8 is a diagram that shows an exemplary 3×3 pixel imaging array embodiment according to present teachings.

A plurality of sensor pixels 700 can be tiled in a matrix fashion to form an imaging array. FIG. 8 shows a schematic equivalent diagram of a 3×3 pixels imaging array according to the present teachings. The bias line 170 can be shared among pixels in each column and is connected to the sensor bias circuitry. Please note that since the photoelectric conversion elements 120 in the sensor pixels 700 are usually biased at approximately the same voltage, the bias line 170 can also be shared among pixels in each row or shared among any combination of pixels depending on the pixel layout constraints. The data line 160 can be shared among pixels in each column and is connected to the readout electronics. The scan line 150 can be shared among pixels in each row and is connected to the driving circuitry. The driving circuitry provides the appropriate signals on scan lines 150 to release the signals stored on the floating nodes 140 of the pixels 700 to the data lines 160 one row at a time. For example, the signals stored on the floating nodes 140 of the pixels 700 can be released in sequence from a single row. The second terminal of the on-pixel storage capacitor 130 can be electrically connected to the floating node 140. The first terminal of the on-pixel storage capacitor can be electrically connected to the bias line 170. In comparison to FIG. 2, FIG. 8 does not require extra ground line 340 routings for the on-pixel storage capacitor 130.

FIGS. 9A-16A illustrates the top-down views of representative pixel 700 at various fabrication stages, according to a first exemplary embodiment of the present teachings; FIGS. 9B-16B illustrates the cross-sectional views of the pixel 700 that respectively corresponds to FIGS. 9A-16A. The cutting-plane line B-B' for the cross-sectional views is shown in corresponding top-down view illustrations.

It is noted that according to embodiments of the present application, each layer discussed can be formed on, over, or proximate to the previously formed layer, directly or indirectly, respectively. For example, an insulating layer can comprise more than one insulator and a metal layer can comprise more than one metal. Additionally, other layers (not shown) can be formed between the layers illustrated in the figures that are not directly discussed, but are well known in semiconductor processing.

Pixel 700 discussed in the first embodiment reference to a back-channel etched (BCE) hydrogenated amorphous silicon (a-Si:H) TFT as the switching element 110 and an a-Si:H n-i-p photodiode as the photoelectric conversion element 120. However, the photoelectric conversion element 120 can be any one or combination of MIS photosensors, vertical p-n junction photodiodes, lateral p-n junction photodiodes, photoconductors, photo-transistors fabricated from inorganic, organic semiconducting materials, etc. Similarly, the switching element 110 can be any one or combination of MOS thin-film-transistors, junction field-effect-transistors, fully-depleted SOI transistors, partially-depleted SOI transistors, SiOG transistors, bulk MOS transistors, bi-polar transistors, etc.

As one of skill in the art will recognize for indirect X-ray detectors employing photoelectric conversion elements 120, an X-ray conversion screen, such as CsI or $Gd_2O_2S$:Tb, can be positioned in proximity to the photosensors. Also, for direct X-ray detectors, X-ray sensitive photosensors, such as photoconductors can be employed. Examples of materials for X-ray sensitive photoconductors can include amorphous selenium (a-Se), CdTe, etc.

Figure 9A:
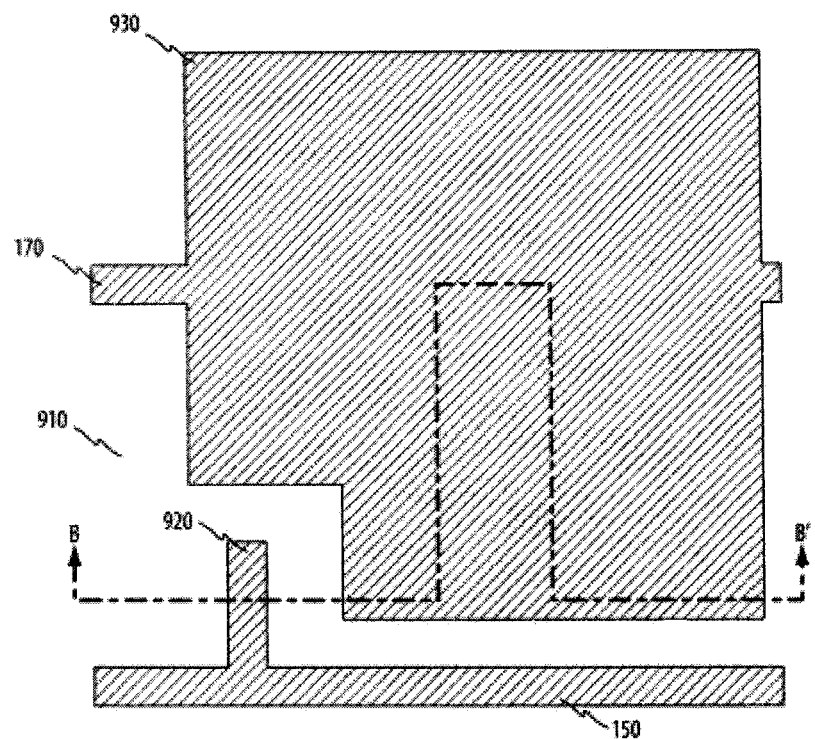
Figure 9B:
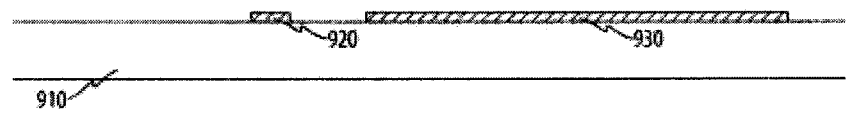

In FIG. 9A and FIG. 9B, the scan line 150, the bias line 170, a gate electrode 920, and a first electrode 930 of the on-pixel storage capacitor 130 can be formed over or proximate to the first surface of substrate 910. The scan line 150 and a region of the bias line 170 can be formed in the same metal layer. If scan line 150 and portion of the bias line 170 are formed in the same metal layer, then the scan line 150 can be substantially parallel to a portion of the bias line 170, as shown in FIG. 9A. This parallel configuration can also be present when the scan line 150 and the bias line 170 are not in the same metal layer. In one embodiment, the bias line 170 is wider than the scan line 150. Alternatively, except for the configuration shown in FIG. 9A (e.g., formation in the same metal layer), the scan line 150 can instead be substantially transverse to a portion of the bias line 170 when formed in different metal layers. Further, in some embodiments, the bias line 170 can also have portions that can be both parallel and transverse to the scan line. In addition, portion(s) of the bias line 170 and the first electrode 930 can be between the first surface of substrate 910 and first terminal of the photoelectric conversion element 120 (not shown in FIG. 9A and FIG. 9B).

Figure 10A:
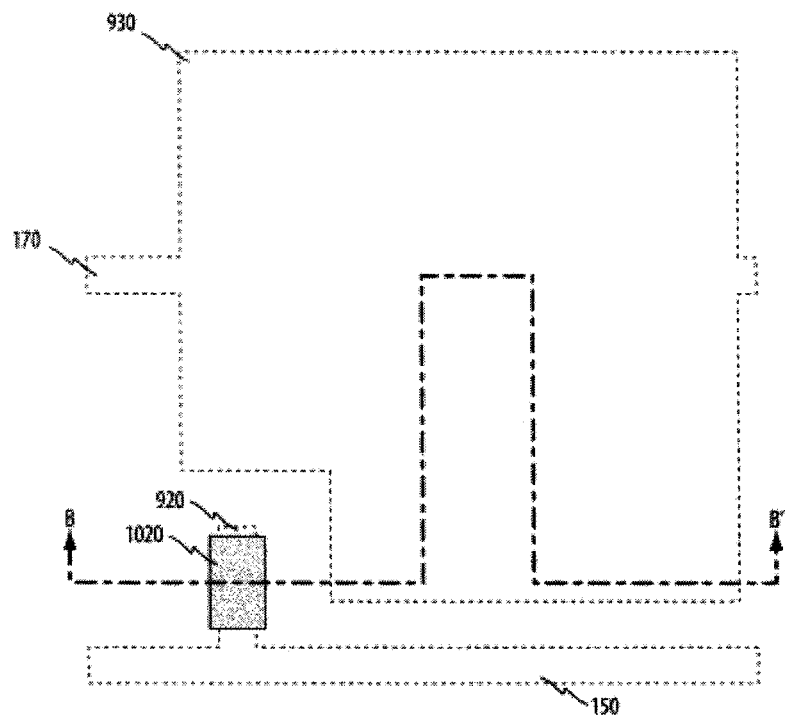
Figure 10B:
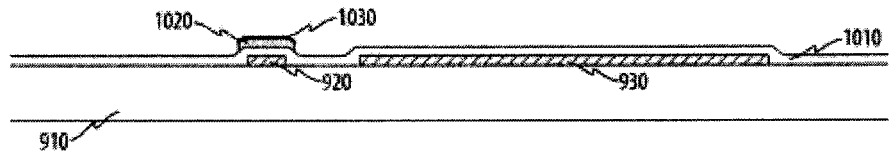

In FIG. 10A and FIG. 10B, gate insulating layer 1010 (e.g., TFT) is shown formed over or proximate to the entire surface of the substrate 910 including the scan line 150, the bias line 170, the gate electrode 920, and the first electrode 930 of the on-pixel storage capacitor, (e.g. to cover the scan line 150, the bias line 170, the gate electrode 920, the first electrode 930 of the on-pixel storage capacitor, and any exposed surface of the substrate 910). The gate insulating layer 1010 can be a non-stoichiometric silicon nitride (a-$SiN_x$:H), or other types of insulating layers, e.g., oxides, etc. either single or stacked, as known in the art. The TFT active layer (e.g., active island 1020) and doped contact layer (e.g., doped contact layer island 1030) can be formed over or proximate to the entire surface of the substrate 910 after the formation of the gate insulating layer 1010, e.g. through Plasma Enhanced Chemical Vapor Deposition (PECVD) of intrinsic and doped a-Si:H. The TFT active island 1020 can be formed by patterning the active layer and the doped contact layer island 1030 can be formed by patterning the doped contact layer, e.g. through patterning by dry etching, etc. In FIG. 10A, the doped contact layer island 1030 is omitted for clarity.

The deposition of these layers and patterning can be variously performed. For example, the gate insulator 1010, the active island 1020, and the doped contact layer island 1030, shown in FIG. 10B can be formed by forming layers consecutively before patterning to form the active island. Alternatively, formation of the active island 1020 and doped contact layer island 1030 may be after patterning the gate insulator layer 1010 (not shown). Alternatively, with the gate insulator layer 1010, active layer, and doped contact layer formed consecutively, the patterning of the gate insulator layer 1010 can be performed after the formation of the active island.

Figure 17:
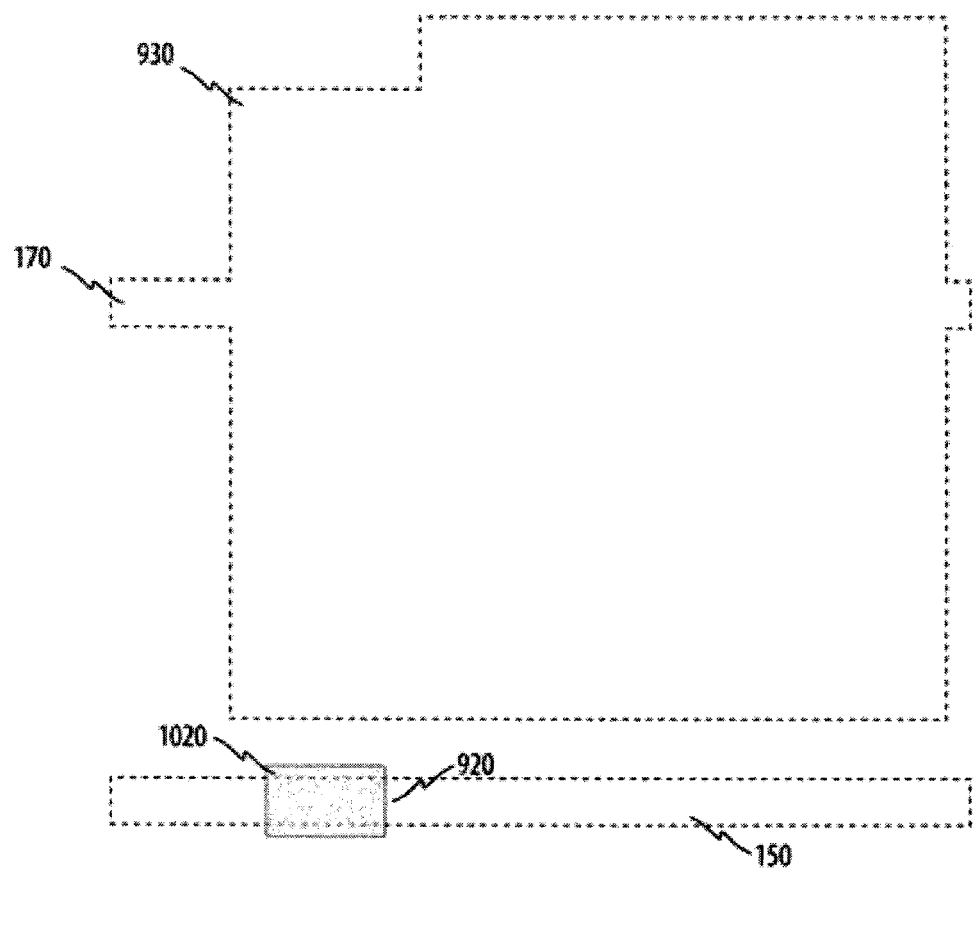
FIG. 17 is a diagram that illustrates an alternative placement of an exemplary active island embodiment for a switching element according to the present teachings.

As seen in FIG. 10A, an a-Si:H TFT as switching element 110 (not shown as completed) can be formed over a surface of substrate 910 where the active region of the a-Si:H TFT is over or proximate to the gate electrode 920. Alternatively, in some embodiments the active region of the a-Si:H TFT can also be over or proximate to, and aligned with, the scan line 150. One exemplary alternative configuration is shown in FIG. 17. Portions of the scan line 150, as shown in FIG. 17, can be between the active layer (e.g., active island 1020) and the surface of the substrate 910, and can be considered as the TFT gate electrode 920. Due to the widths of the scan line 150 and the second and third terminals (not shown) of the TFT as switching element 110, the overlap tolerance of the pixel 700 shown in FIG. 17 can be reduced from conventional TFT array backplane 300. For example, the tolerance in at least one direction, e.g., parallel to the scan line can be reduced because shifting left or right (in FIG. 17) does not affect the gate electrode alignment with the active layer. Alternatively, portions of the scan line 150 that a-Si:H TFT as switching element 110 (not shown) cover can be resized to achieve desired channel length.

Figure 11A:
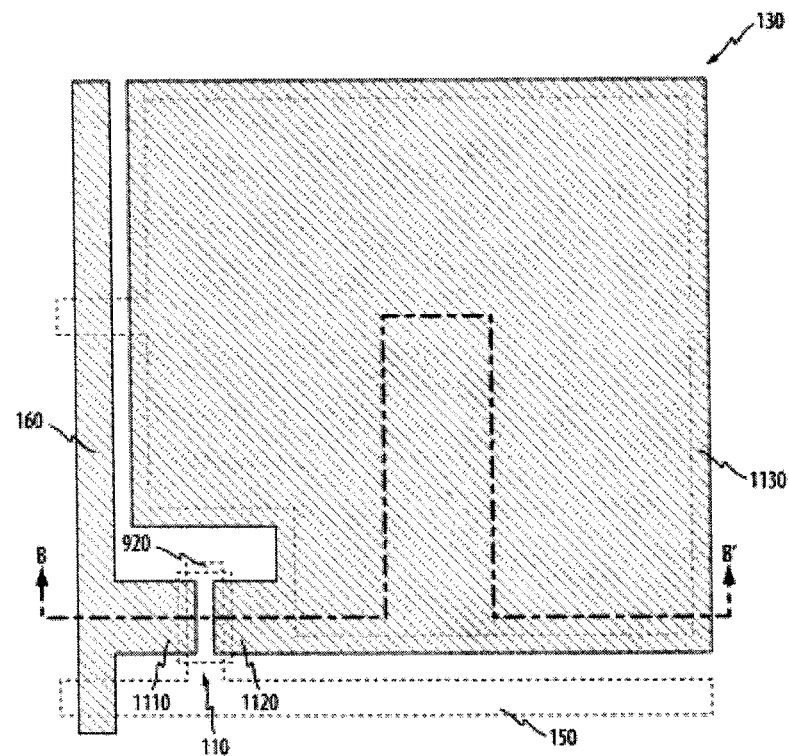
Figure 11B:
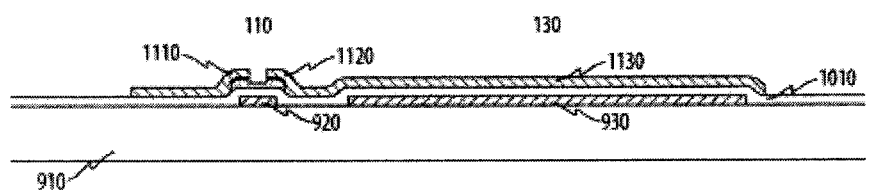

FIG. 11A and FIG. 11B illustrate exemplary formation of two terminals of the switching element 110. As shown in FIG. 11A and FIG. 11B, terminal 1120 can connect to photoelectric conversion element 120 (not shown), and terminal 1110 can connect to the data line 160. Regions of the doped contact island 1030 between the two TFT terminals can be removed and portions of the active island 1020 can also be removed. The data line 160 can also be formed in this metal layer (e.g., second metal layer), and is shown substantially perpendicular to scan line 150 in FIG. 11A. Alternatively, the data line 160 can be formed in a top metal layer (not shown) instead of the TFT terminal metal layer as shown. The second electrode 1130 of the on-pixel storage capacitor can also be formed in this layer. As shown in FIG. 7, since the third electrode 1120 of the TFT, the second electrode 1130 of the on-pixel storage capacitor, and the floating node electrode 1810 of the photodiode (not shown) are electrically connected forming the floating node 140, in some embodiments the second electrode 1130 of the on-pixel storage capacitor can act as a metal electrode for the photodiode as photoelectric conversion element 120. Further, the third electrode 1120 of the TFT and the second electrode 1130 of the on-pixel storage capacitor can be formed simultaneously and be electrically connected (e.g., as shown in FIG. 11A and FIG. 11B). The first electrode 930 of the on-pixel storage capacitor, the second electrode 1130 of the on-pixel storage capacitor, and the gate insulating layer 1010 in between the two electrodes can form the on-pixel storage capacitor 130, where one terminal is connected to the bias line 170 while the other terminal is connected to the photoelectric conversion element 120 (not shown) of the sensor pixel 700. The gate electrode 920, the second electrode 1110 of the TFT, the third electrode 1120 of the TFT, and the active island can form the a-Si:H TFT as switching element 110 of the sensor pixel 700. It is noted here that the desired $C_{st}$ can be achieved by varying any combination of the area of the electrodes (e.g., 930, 1130) of the on-pixel storage capacitor 130, the thickness of the gate insulating layer 1010, specific layers forming the gate insulating layer 1010, the material properties of the gate insulating layer 1010.

Figure 12A:
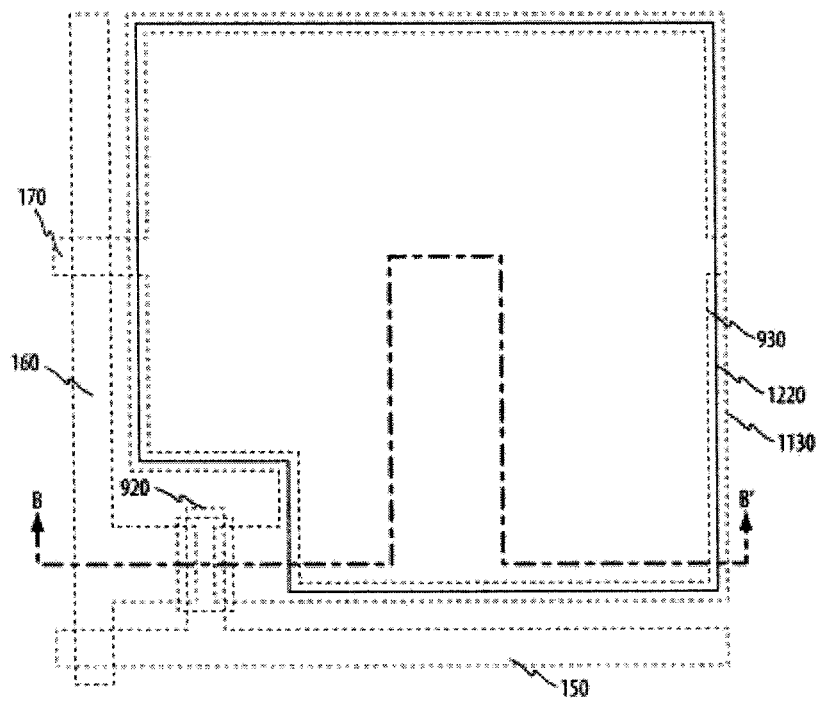
Figure 12B:
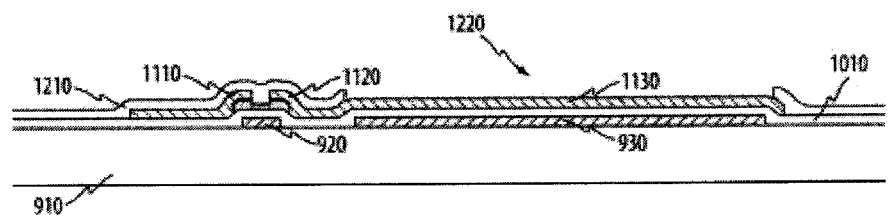
Figure 18A:
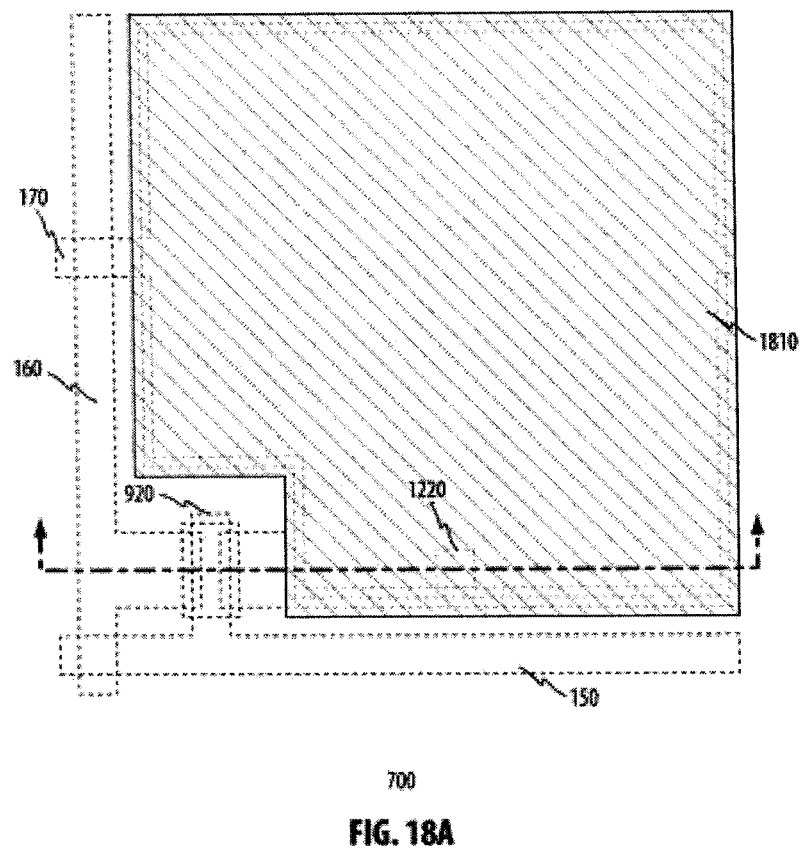
FIG. 18A is a diagram that illustrates the top-down view of an intermediate structure of an alternative exemplary pixel embodiment according to the present teachings.
Figure 18B:
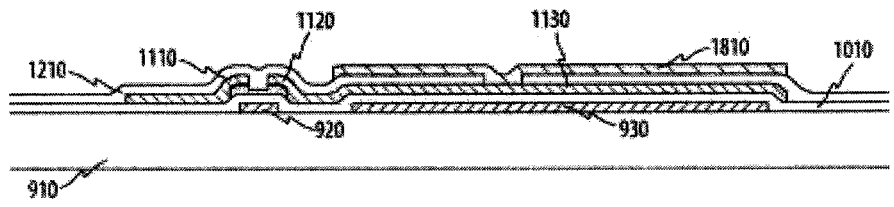
FIG. 18B is a diagram that illustrates a cross-sectional view of the pixel corresponding to FIG. 18A.

FIG. 12A and FIG. 12B illustrate exemplary formation of TFT passivation layer (e.g., over the entire surface of the previously formed features as shown). A passivation layer 1210 can be patterned to expose a portion of the second electrode 1130 of the on-pixel storage capacitor. For the case where the second electrode 1130 of the on-pixel storage capacitor is also used as an electrode for the photosensor/photoelectric conversion element 120, the floating node via window 1220 can optionally be made large, approximately the same size as the second electrode 1130 of the on-pixel storage capacitor. Such an exemplary embodiment is shown in FIG. 12A and FIG. 12B. In the case where the second electrode 1130 of the on-pixel storage capacitor is not used as an electrode of the photoelectric conversion element 120, the floating node via window 1220 can optionally be made small, (e.g., <½ the size of the second electrode 1130 of the on-pixel storage capacitor, <¼ the size of the second electrode 1130, as small as possible without affecting the connectivity between the second electrode 1130 of the on-pixel storage capacitor and a electrode of the photodiode as photoelectric conversion element 120. FIG. 18A and FIG. 18B illustrates the top-view and cross-sectional view of an exemplary structure after the formation of the photodiode floating node electrode that can be electrically connected to the second electrode 1130 of the on-pixel storage capacitor, respectively. As shown in FIG. 18A and FIG. 18B, the floating node via window 1220 is made relatively small.

Figure 13A:
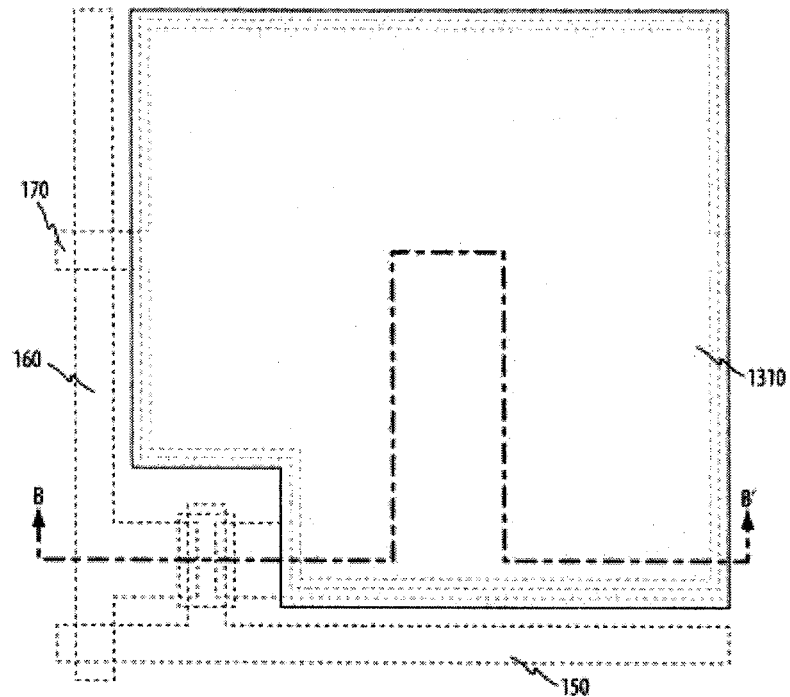
Figure 13B:
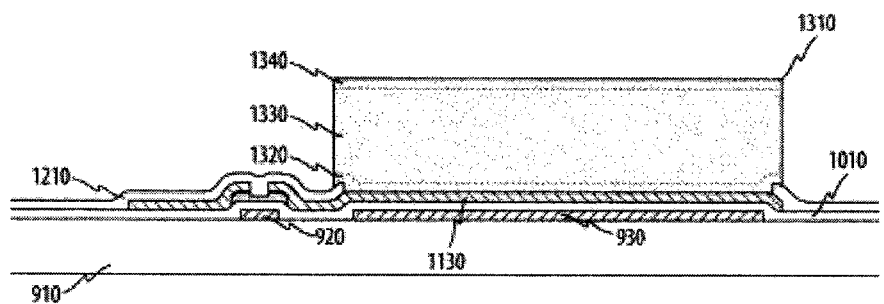

FIG. 13A and FIG. 13B illustrate exemplary formation of the a-Si:H n-i-p photodiode stack 1310. The photodiode stack can include an n-type doped a-Si:H layer 1320 (hereinafter referred to as n-layer), a relatively thick intrinsic a-Si:H layer 1330 (hereinafter referred to as i-layer), and a p-type doped a-Si:H layer 1340 (hereinafter referred to as p-layer). The three layers can be deposited in sequence (e.g., in a continuous manner), followed by a dry etch process to define the photodiode stack 1310 area. It is noted here that the photodiode stack 1310 can also be formed in reverse sequence where p-layer 1340 is formed, then i-layer 1330, then n-layer 1320, usually in a continuous manner. The resulting structure would then be referred to as p-i-n photodiode. Such difference is well known in the art and both configurations are often denoted as PIN photodiode. As shown in FIG. 13A and FIG. 13B, the photodiode stack 1310 area can be approximately coextensive with the second electrode of the on-pixel storage capacitor 1130.

Figure 14A:
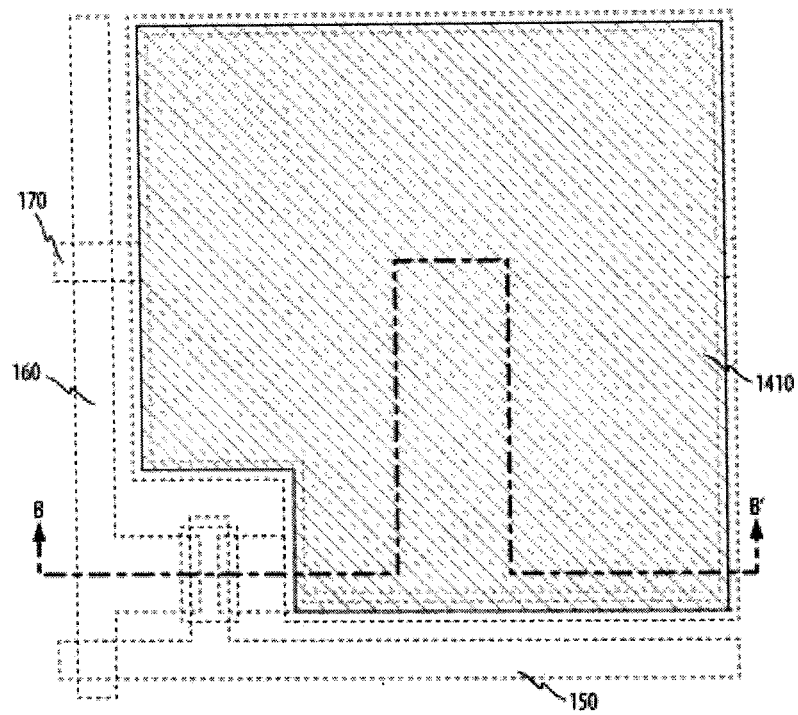
Figure 14B:
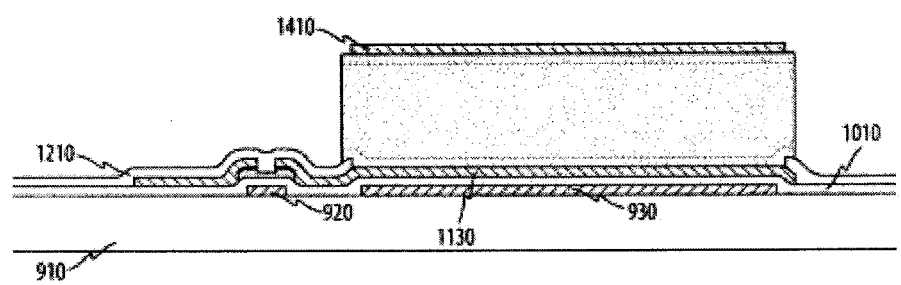

FIG. 14A and FIG. 14B illustrate exemplary formation of the photodiode bias electrode 1410. In the case where majority of the incident photons impinge the photodiode bias electrode first, the electrode is usually made optically transparent (e.g., partially transparent) using transparent conducting oxides (TCO), such as ITO. It is noted here that the formation of the photodiode stack 1310 and the photodiode bias electrode 1410 can also be done in a different sequence. In such case, the layer of the photodiode stack 1310 and the photodiode bias electrode 1410 is deposited in sequence; however, the photodiode bias electrode 1410 layer is patterned prior to the patterning of the photodiode stack 1310. Both such exemplary sequences would result in the structure shown in FIG. 14A and FIG. 14B.

Figure 15A:
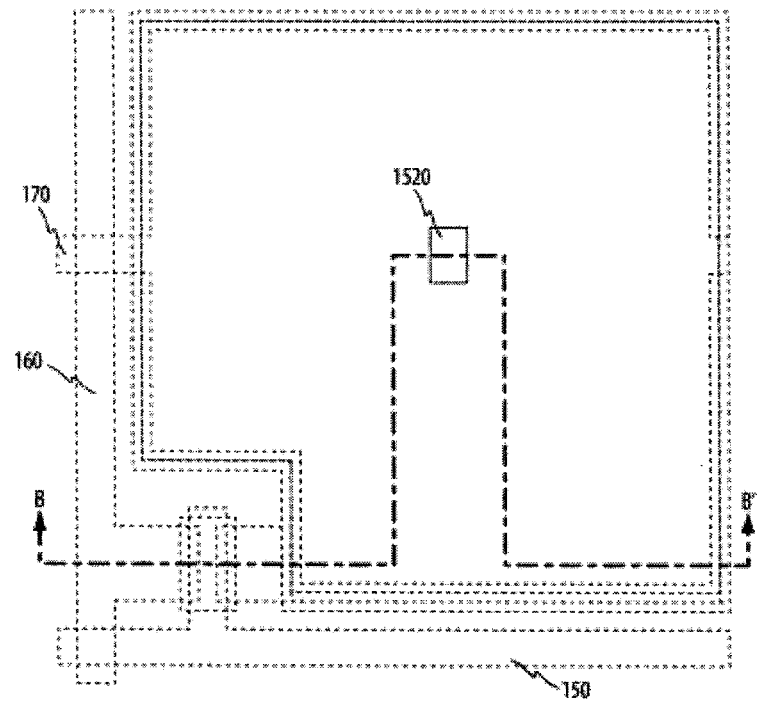
Figure 15B:
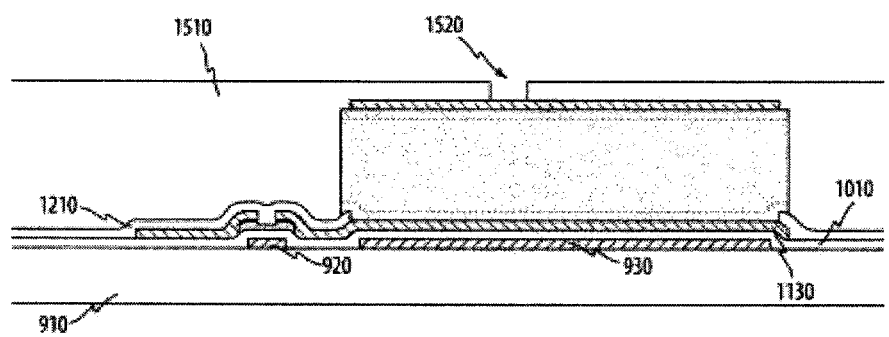

FIG. 15A and FIG. 15B illustrate exemplary formation of the photodiode as the photoelectric conversion element 120 passivation layer. Such a passivation layer 1510 can be formed over the surface of the previously formed features of pixel 700. Also shown in FIG. 15A and FIG. 15B, the bias line via window 1520 can be formed (e.g., dry etching). Note that if the data line 160 is routed in metal layers formed after photodiode passivation layer (not shown), an additional via window (not shown) can be etched to connect the second electrode 1110 of the TFT to the data line 160.

Figure 16A:
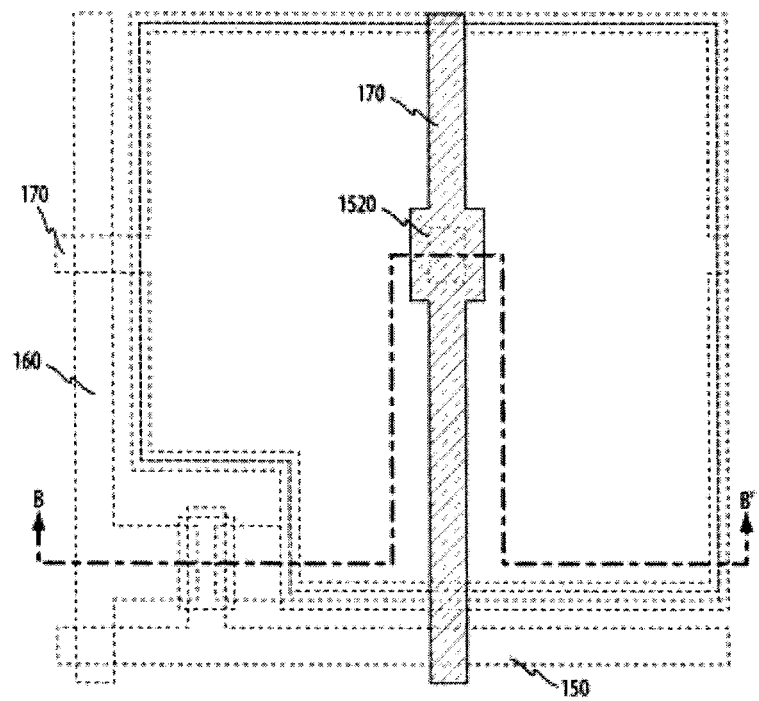
Figure 16B:
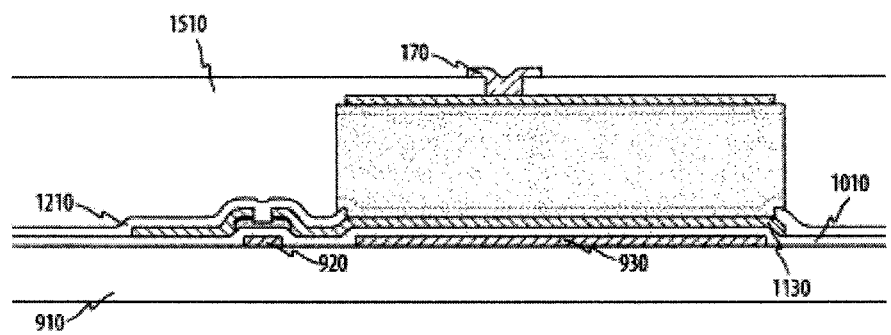

FIG. 16A and FIG. 16B illustrate exemplary formation of another metal layer (e.g., third metal layer) filling the previous via openings, including the bias line via window 1520. The metal layer may be patterned to form a portion of the bias line 170. It is noted that the bias line 170 portion formed to connect the first electrode 930 of the on-pixel storage capacitor as shown in FIG. 9A can be electrically connected to the bias line 170 portion formed as illustrated in FIG. 16A and FIG. 16B either externally in the sensor biasing circuitry (e.g., as shown in FIG. 8) or at the immediate peripheral of the sensor array through single or multiple routing vias. Single or multiple metal layers may exist between the connection vias of the bias line 170 portions.

Pixel 700 processing can continue with additional depositions and etchings, e.g., passivation, planarization, anti-reflection coating, forming periphery connections, etc. as well known in the art. It is noted that periphery connections can be formed during the above discussed process or after the forming of the pixels. In addition, as well be understood by one of ordinary skill in the art, additional layers of inorganic or organic dielectrics can be deposited and patterned for encapsulation and to improve optical performance of the formed imaging arrays. Additional layers of conductors can be deposited and patterned for imaging array pad bonding purposes.

As described in exemplary embodiments of the sensor pixel 700, a pixel charge capacity is increased by the addition of an on-pixel storage capacitor 130. The on-pixel storage capacitor 130 can be formed in parallel with the BCE a-Si:H TFT process or a BCP a-Si:H TFT process; therefore, without any additional processing steps required while fabricating a sensor array of pixels 700. Thus, such exemplary embodiments can provide a means of boosting the pixel charge capacity without additional cost associated with extra masks or photolithography steps and/or can ensure no loss or reduced yield caused by additional processing steps. It is also noted that since the on-pixel storage capacitor 130 can be placed underneath the photodiode as the photoelectric conversion element 120, the fill-factor of the pixel is not affected. Furthermore the present teachings can reduce or remove the requirement for additional ground routing lines for the on-pixel storage capacitor 130. As shown in the first pixel embodiment of FIG. 16A and FIG. 16B, the bias line 170 can be optionally routed in multiple metal layers, both of which can improve the manufacturing reliability or yield.

A second exemplary embodiment describes an alternative of the sensor pixel 700 (e.g., fabrication process). These descriptions, along with illustrations, highlight several differences in the fabrication process, some of which have been already described in the first embodiment. These differences in processes show that the present teachings do not just apply to one particular fabrication process (e.g., embodiment) but a number of fabrication processes (e.g., embodiments), all of which can benefit from aspects of the present application.

The first embodiment described referring to FIG. 9A to FIG. 16B included the fabrication of the on-pixel storage capacitor 130 in parallel with a BCE a-Si:H TFT as switching element 110. In this second embodiment, the on-pixel storage capacitor 130 can be fabricated in parallel with a back-channel passivated (BCP) a-Si:H TFT as switching element 110. In this second embodiment, an additional metal layer can be formed to act as the photodiode floating node electrode 1810.

At least this differentiates from the fabrication processes described in the first embodiment where the second electrode 1130 of the on-pixel storage capacitor can operate as the floating node electrode 1810 of the photodiode. Further, such a difference was described referring to FIG. 18A and FIG. 18B, where the sensor pixel 700 is using a BCE a-Si:H as the switching element 110. In addition, the first exemplary embodiment describes two different fabrication process sequences for the a-Si:H n-i-p photodiode stack 1310 and the photodiode bias electrode 1410. In this second exemplary embodiment, the alternative a-Si:H n-i-p photodiode fabrication process sequence is described with the aid of top-view and cross-sectional view illustrations.

FIGS. 19A-24A illustrates the top-down views of a second exemplary embodiment of representative pixel 700 at various fabrication stages, according to the present teachings; FIGS. 19B-24B illustrates the cross-sectional views of the pixel 700 that respectively correspond to FIGS. 19A-24A. The cutting-plane line B-B' for the cross-sectional views is shown in corresponding top-down view illustrations.

Figure 19A:
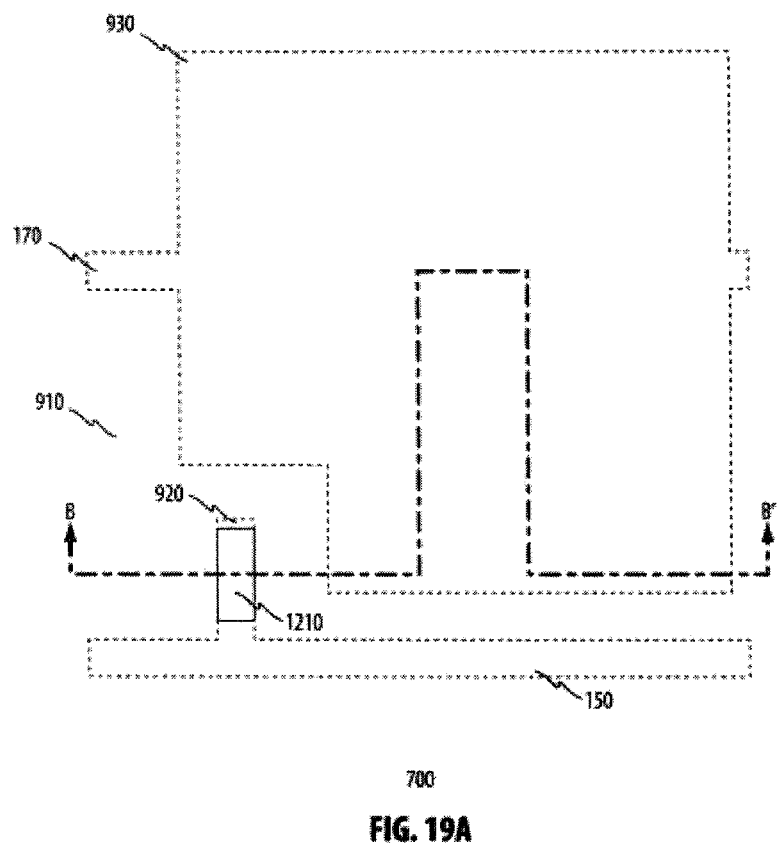
Figure 19B:
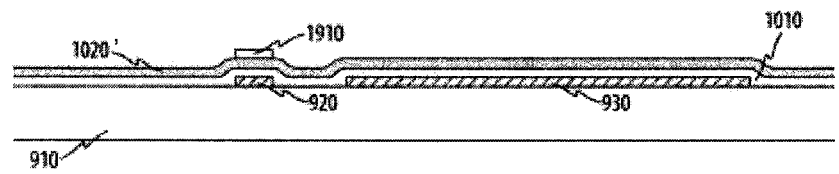

In FIG. 19A and FIG. 19B, the scan line 150, the bias line 170, the gate electrode 920, and the first electrode 930 of the on-pixel storage capacitor 130 can be formed over or proximate to the first surface of substrate 910. The gate insulating layer 1010, an active layer 1020' and a back-channel passivation layer 1910 can be formed over or proximate to the entire surface of the substrate 910 including the scan line 150, the bias line 170, the gate electrode 920, and the first electrode 930 of the on-pixel storage capacitor 130 (e.g. to cover the scan line 150, the bias line 170, the gate electrode 920, the first electrode 930 of the on-pixel storage capacitor 130, and any exposed surface of substrate 910). The back-channel passivation layer 1910 can be a non-stoichiometric silicon nitride (a-SiN$_x$:H), or other types of insulating layers, e.g., oxides, etc. either single of stacked, as known in the art. The back-channel passivation layer 1910 can also act as a blocking layer when the doped a-Si:H contact layer island 1030 (not shown) is etched. The depositions of these three layers usually can be done continuously in sequence through PECVD. The back-channel passivation layer 1910 can be patterned so that portion of the material remain in proximity to the channel region of the a-Si:H TFT as switching element 110 (e.g., aligned with the TFT gate electrode 920 as shown in FIG. 19A and FIG. 19B).

Figure 20A:
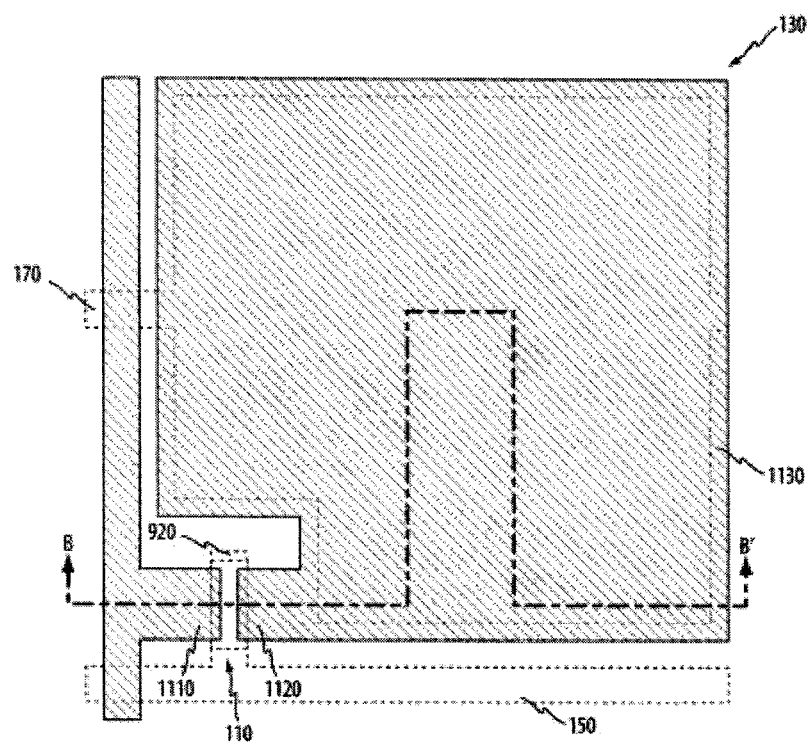
Figure 20B:
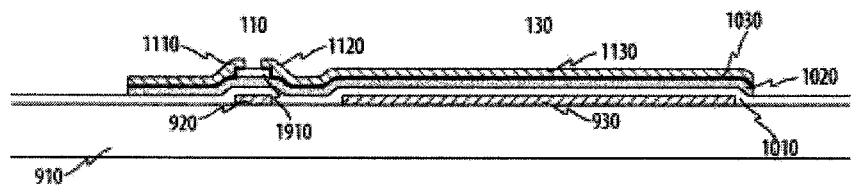

FIG. 20A and FIG. 20B illustrate exemplary formation of two terminals of the switching element TFT 110. An n-type doped a-Si:H layer and a metal layer can be formed over or proximate to the entire surface of the substrate 910, covering portion of the previously formed features. The metal layer and n-type doped a-Si:H layer can be patterned to form the electrodes of the switching element 110; one terminal 1110 can connect to the data line 160, and another terminal 1120 can connect to the second electrode 1130 of the on-pixel storage capacitor. The TFT electrodes 1110, 1120, the data line 160, and the second electrode 1130 of the on-pixel storage capacitor can be formed simultaneously and be electrically connected as shown in FIG. 20A and FIG. 20B. The first electrode of the on-pixel storage capacitor 930, the second electrode 1130 of the on-pixel storage capacitor, and the portions of the layer (e.g., including the gate insulating layer 1010, the a-Si:H active layer 1020, the n-type doped a-Si:H layer 1130) in between the two electrodes 930, 1130 can form the on-pixel storage capacitor 130. One terminal of the on-pixel storage capacitor 130 can be connected to the bias line 170 while the other terminal can be connected to the photoelectric conversion element 120 (not shown) of the sensor pixel 700. The on-pixel storage capacitor 130 shown in FIG.

20B contains multiple layers of different materials sandwiched in between the electrodes. As shown in FIG. 20B, the gate electrode 920, the second electrode 1110 of the TFT, the third electrode 1120 of the TFT, and other layer materials in proximity (including the gate insulating layer 1010, the a-Si:H active layer 1020, the n-type doped a-Si:H layer 1130) forms the a-Si:H TFT switching element 110 of the sensor pixel 700.

Figure 21A:
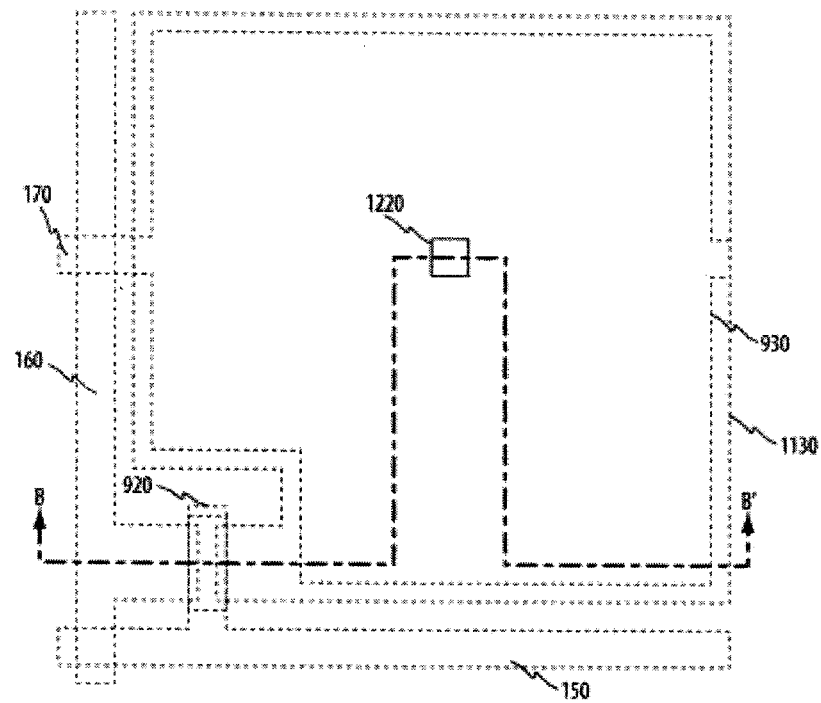
Figure 21B:
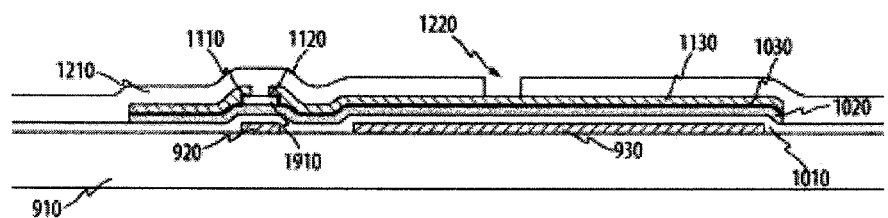

FIG. 21A and FIG. 21B illustrate exemplary formation of passivation layer 1210 (e.g. over the entire surface of the previously formed features as shown). The passivation layer 1210 can be patterned to expose a portion of the second electrode 1130 of the on-pixel storage capacitor. Since the second electrode 1130 of the on-pixel storage capacitor is not used directly as an electrode for the as photoelectric conversion element 120, the floating node via window 1220 can be made relatively smaller, yet preferably not affecting the connectivity between the second electrode 1130 of the on-pixel storage capacitor and the floating node electrode 1810 of the photodiode (not shown).

Figure 22A:
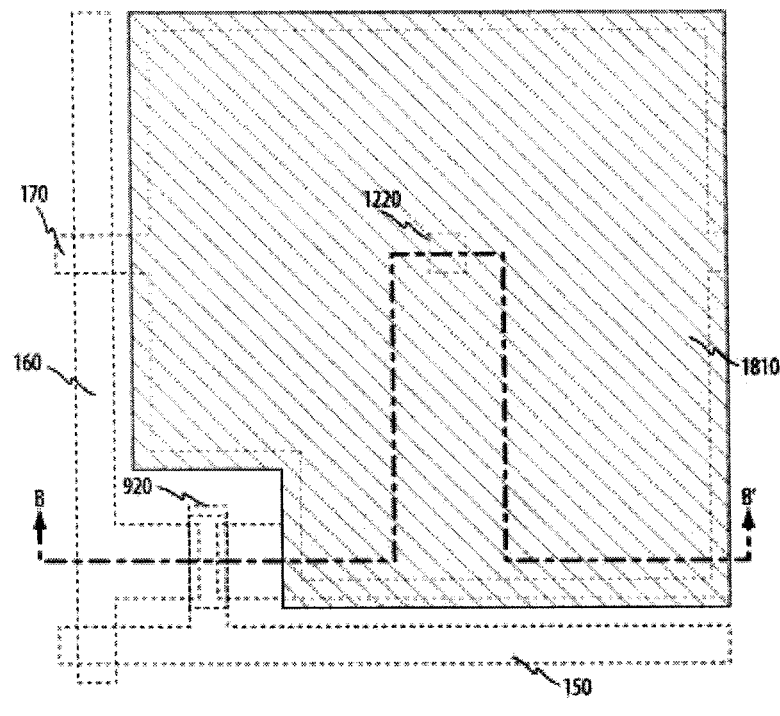
Figure 22B:
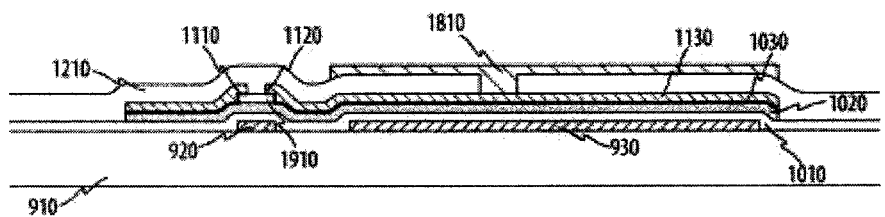

FIG. 22A and FIG. 22B illustrate exemplary formation of the floating node electrode 1810 of the photodiode. A metal layer can be formed over or proximate to the entire surface of the substrate 910, (e.g., covering portions of the previously formed features). The metal layer can be then patterned to approximately the same area as second electrode 1130 of the on-pixel storage capacitor (e.g., the photodiode stack 1310 (not shown)). The second electrode 1130 of the on-pixel storage capacitor can be connected to the floating node 1810 of the photodiode through via window 1220. As shown in FIG. 22B, both electrodes and the third electrode 1120 of the TFT can be electrically connected forming the floating node 140.

Figure 23A:
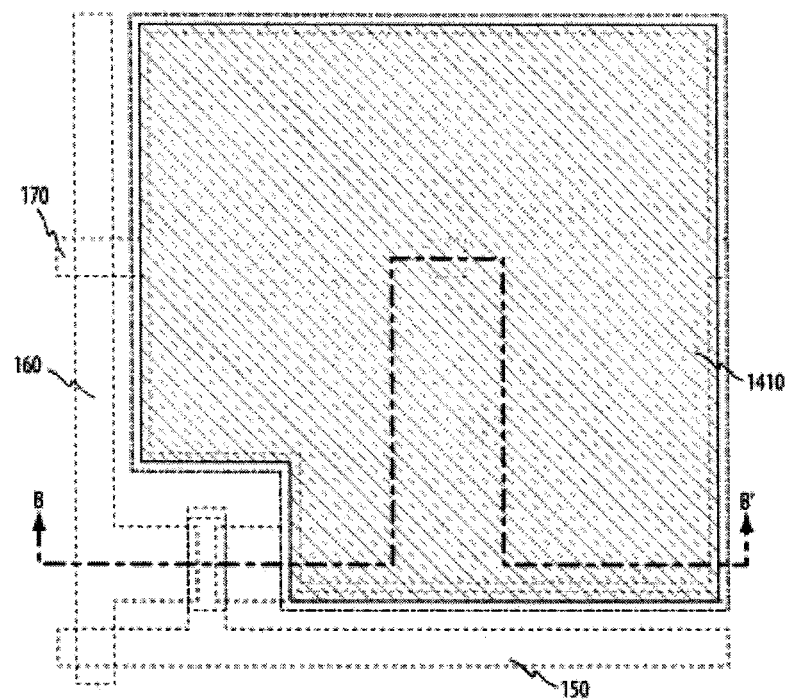
Figure 23B:
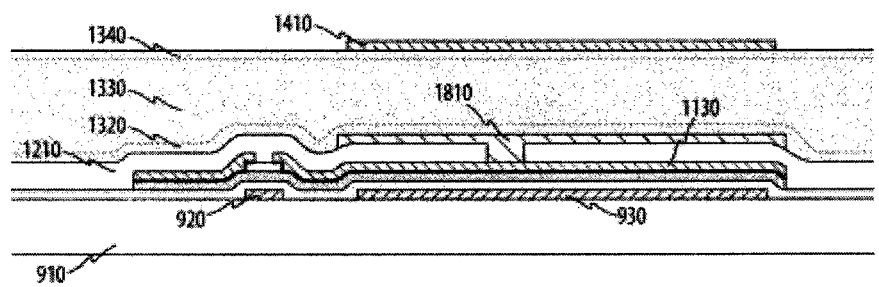

FIG. 23A and FIG. 23B illustrate exemplary formation of the photodiode bias electrode 1410. Unlike the process described in the first embodiment, the n-layer, i-layer, p-layer, and bias electrode 1410 layer can be consecutively formed over or proximate to the entire surface of the substrate 910 (e.g., covering portions of the previously formed features). The bias electrode 1410 layer can be made somewhat optically transparent and can be patterned to form the bias electrode for the photodiode as the photoelectric conversion element 120.

Figure 24A:
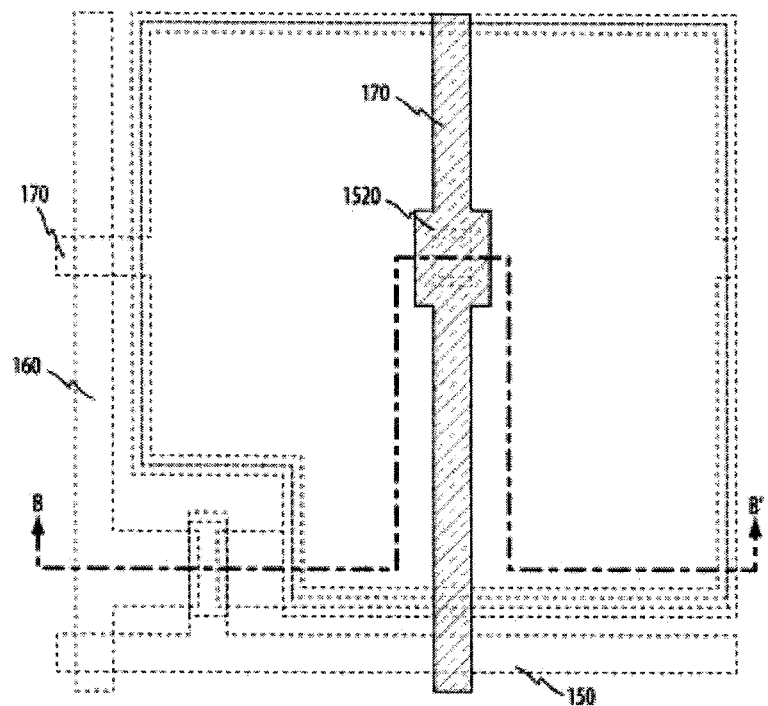
Figure 24B:
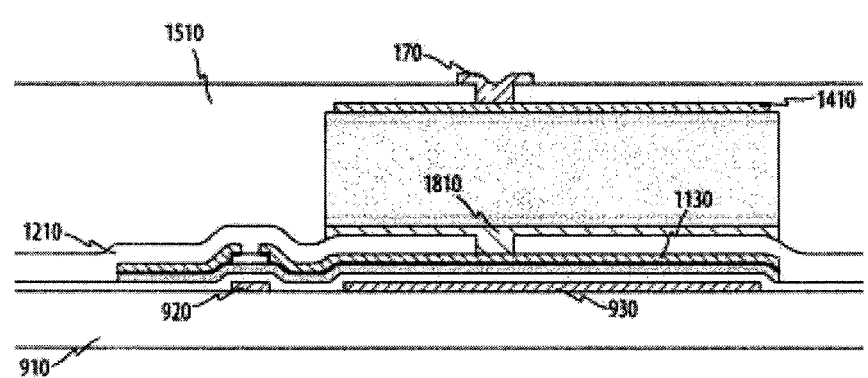

FIG. 24A and FIG. 24B illustrates exemplary formation (e.g., completion) of the photodiode with patterning of the photodiode stack 1310 and passivation. FIG. 24A and FIG. 24B also show the bias line 170 exemplary routing across the pixel while electrically connected to the bias electrode 1410 of the photodiode through a via window 1520.

In the first and second exemplary embodiments, portions of exemplary bias lines can be routed in two metal layers (e.g., one bottom metal layer that can be fabricated simultaneously with the TFT as the gate electrode 920 as shown in FIG. 9A, FIG. 9B, FIG. 19A, FIG. 19B, and the other upper metal layer shown to electrically connect the photodiode bias electrode 1410 through a via window as shown in FIG. 16A, FIG. 16B, FIG. 24A, FIG. 24B). These exemplary two bias line 170 portions can be electrically connected either externally in the sensor biasing circuitry as shown in FIG. 8 or at the immediate peripheral of the sensor array through single or multiple routing vias.

An alternative to the bias line connection configuration described above is to electrically connect the top photodiode bias electrode 1410 with the portion of the bias line 170 formed prior to the photodiode stack 1310 individually in each sensor pixel 700. Since the first electrode 930 of the on-pixel storage capacitor can be formed simultaneously with the portions of the bias line 170 and is electrically connected to the portion of the bias line 170 (shown in FIG. 9A and FIG. 9B), the photodiode bias electrode 1410 routing to the bias line 170 that occur in each sensor pixel 700 can be accomplished by electrically connecting the photodiode bias electrode 1410 with the first electrode 930 of the on-pixel storage capacitor via the top metal layer (such as the top metal layer used to route another portion of the bias line 170 as shown in FIG. 16A and FIG. 16B).

FIGS. 25A-28A illustrates the top-down views of a third exemplary embodiment of representative pixel 2500 at various fabrication stages, according to the present teachings; FIGS. 25B-28B illustrates the cross-sectional views of the pixel 2500 that respectively correspond to FIGS. 25A-28A. The cutting-plane line C-C' for the cross-sectional views is shown in corresponding top-down view illustrations. The pixel 2500 can be used for the exemplary schematic circuit and the exemplary imaging array shown in FIGS. 7-8.

Figure 25A:
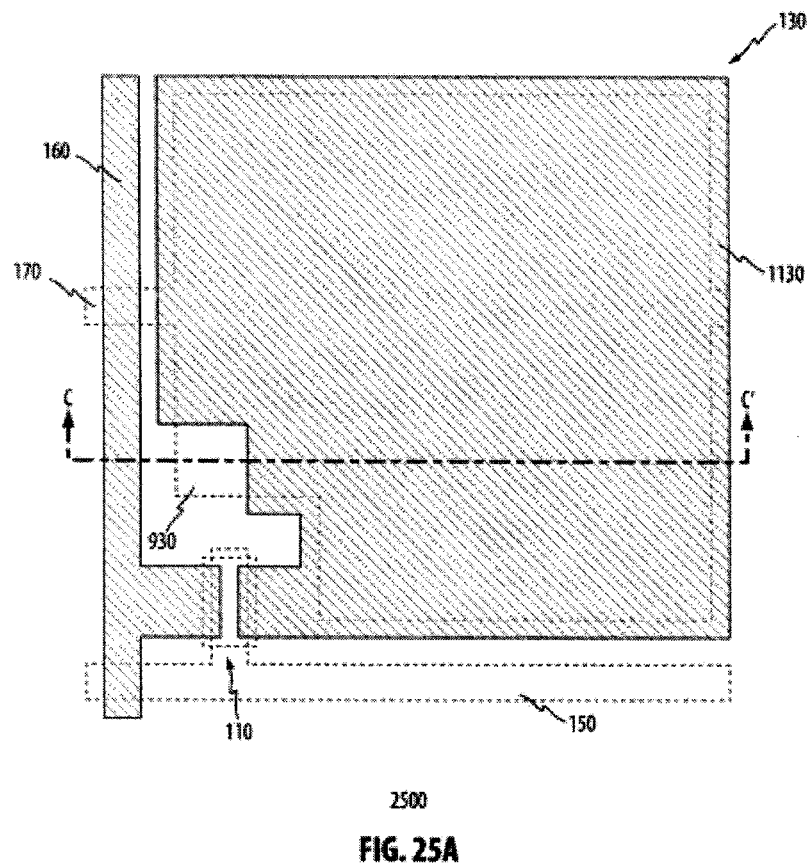
Figure 25B:
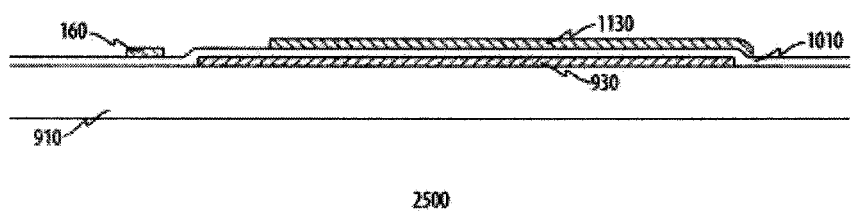

An exemplary structure presented in FIG. 25A and FIG. 25B corresponds to the process that is shown in FIG. 11A and FIG. 11B, respectively. As shown in FIG. 25A and FIG. 25B, the second electrode 1130 of the on-pixel storage capacitor can be formed simultaneously as the third electrode 1120 of the a-Si:H TFT. It is noted here that compared to FIG. 11A in the first exemplary embodiment, a portion of the electrode 1120 can be removed; and this area (e.g., the removed portion) can be used later to perform bias electrode to bias line routing individually in each pixel.

Figure 26A:
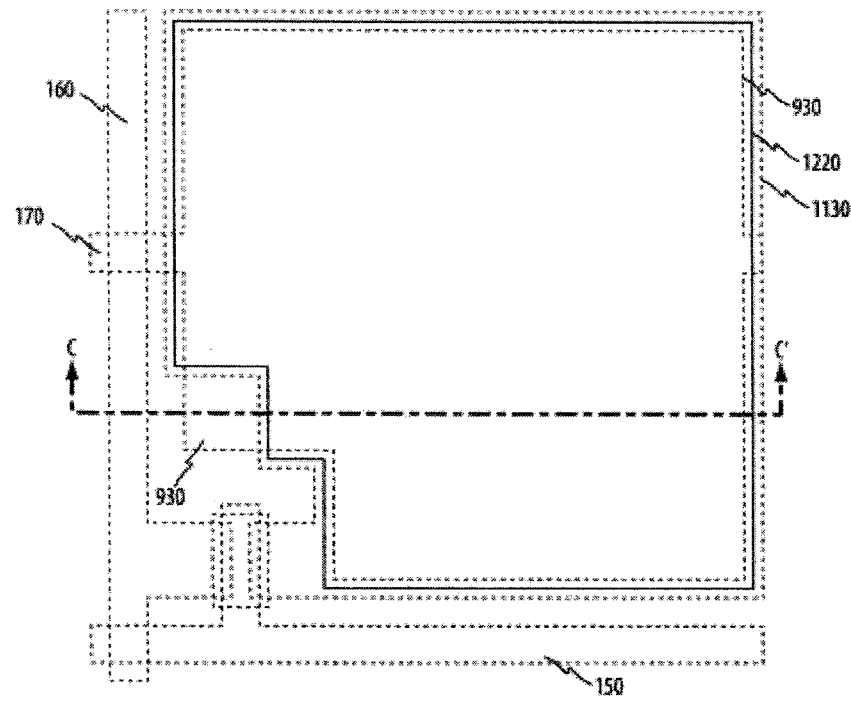
Figure 26B:
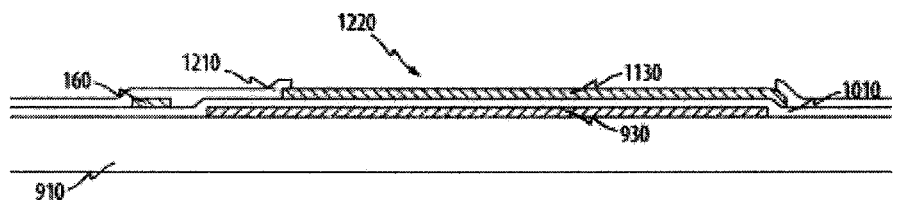
Figure 27A:
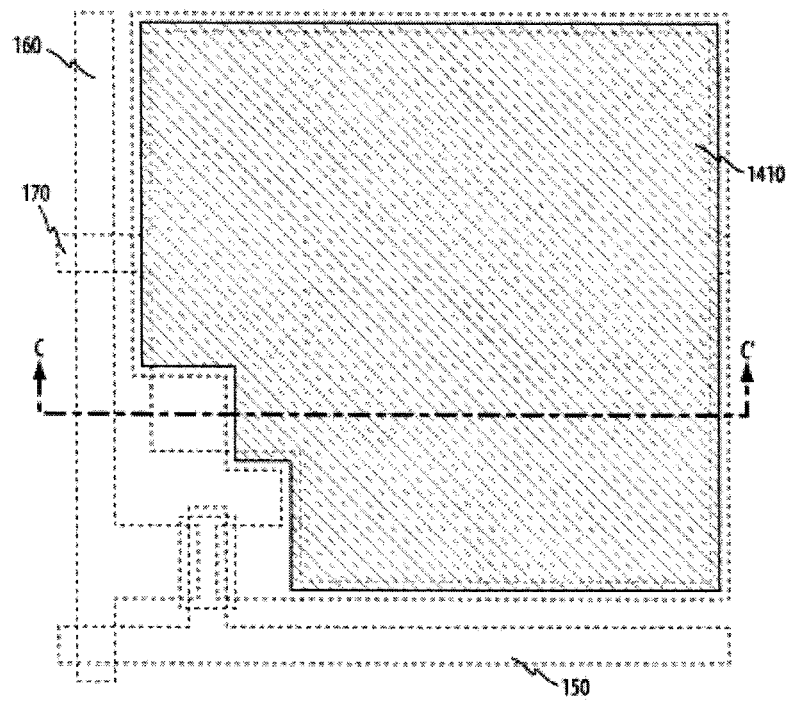
Figure 27B:
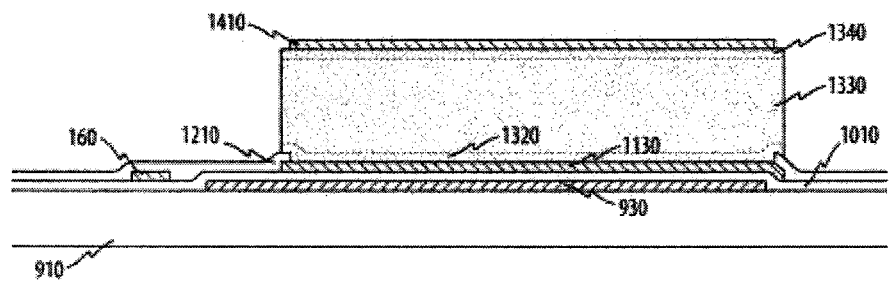
Figure 28A:
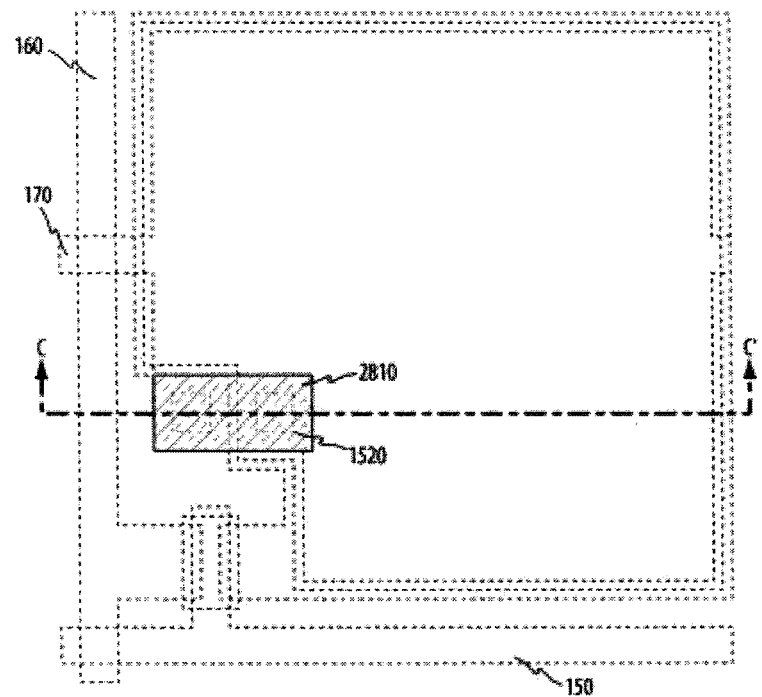
Figure 28B:
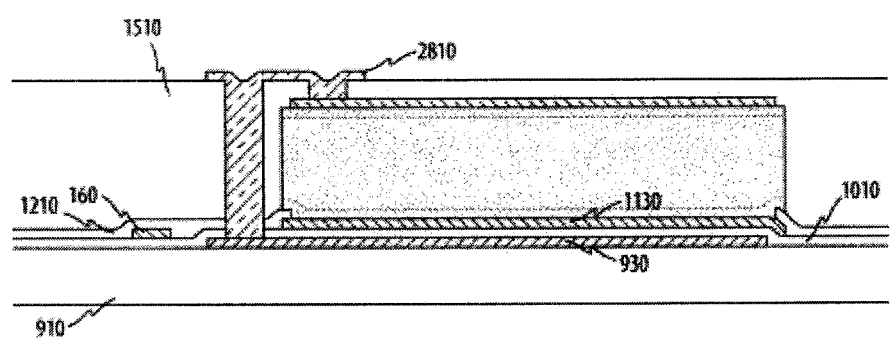

FIG. 26A and FIG. 26B illustrate exemplary formation of passivation layer 1210 (e.g. over the entire surface of the previously formed features as shown). A portion of the passivation layer 1210 can be removed to expose a portion of the second electrode 1130. The aperture opening can be used to connect the second electrode 1130 of the on-pixel storage capacitor to a photodiode as photoelectric conversion element 120 (not shown). The structure shown added in FIG. 26A and FIG. 26B can correspond to the resulting structure described in the first embodiment with illustrations FIG. 12A and FIG. 12B. FIG. 27A and FIG. 27B illustrates exemplary formation of the photodiode stack 1310 and the photodiode bias electrode 1410. The photodiode bias electrode 1410 can be formed either before or after patterning the photodiode stack 1310. The structure shown added in FIG. 27A and FIG. 27B can correspond to the resulting structure described in the first embodiment shown FIGS. 13A-14A and FIGS. 13B-14B.

A photodiode passivation layer 1510 can be formed over the surface of the previously formed features of pixel 2500. This passivation layer 1510 can be patterned to form two via windows on the pixel 2500, one exposing portions of the photodiode bias electrode 1410 and the other exposing a portion of the first electrode 930 of the on-pixel storage capacitor. A metal layer can be formed covering the previously formed via windows. After patterning of the metal layer to form connection metal 2810, the photodiode bias electrode in each pixel is electrically connected to the corresponding bias lines 170 via the connection metal 2810 as shown FIG. 28A and FIG. 28B.

Portions of the bias line 170 covering the transparent bias electrode 1410, as shown in FIG. 16A, can hinder the incident photons capability to reach the photodiode stack (e.g., photoelectric conversion device 120). The embodiment shown in FIG. 28A and FIG. 28B only uses a small portion of the top metal (e.g., connection metal 2810) for the bias electrode 1410 connection to the bias line 170, and therefore can boost the pixel fill-factor. Accordingly, a more efficient pixel 2500 can result since with the same amount of photon flux more photons can reach the photoelectric conversion element 120.

As shown in FIG. 25B, the additional removed portion is at an edge of the electrode 930 adjacent but not part of switch or switching element 110, however, embodiments according to present teachings are not intended to be so limited. For example, the additional removed portion can be located at a center or interior portion of electrode 930 or along an outer circumference of the electrode 930 (e.g., a side opposite from the scan line) to reduce a number of edges to be formed. Such location of the resulting connection metal 2810 preferably does not affect pixel 2500 fill-factor (e.g., the connection metal 2810 area over the bias electrode 1410).

As described in exemplary embodiments of the sensor pixel 2500, a pixel charge capacity can be increased by the addition of an on-pixel storage capacitor 130. As shown in the third pixel embodiment, an increase in charge capacity offered by an additional on-pixel storage capacitor 130 and/or the FF of the pixel may also be increased without any additional processing steps required while fabricating the pixel/sensor array. The increased FF can improve the efficiency of the detector and/or increase the resulting signal-to-noise ratio (SNR).

Exemplary embodiments described above can constrain a selected or maximum area available for an electrode of the on-pixel storage capacitor to be not larger than $p^2$ where p is the pitch of the pixel 700 (e.g., square pixel). This constraint can be understood because for a parallel electrode configuration of a capacitor, the capacitance can be estimated by $\in_o \in_r A/t$ where $\in_o$ is the permittivity of free space, $\in_r$ is the relative permittivity of the dielectric material sandwiched in between the electrodes, t is the thickness of the sandwiched dielectric material, and A is the area of the electrodes. For a given process, $\in_r$ and t are not easily changed; therefore, A is often varied to achieve desired capacitance. As shown in some exemplary embodiments described herein, when the first electrode 930 of the storage capacitor is formed simultaneous with the gate electrode 920 and the scan line 150, a portion of the pixel area $p^2$ is occupied by the gate electrode 920 and scan line 150, and cannot be used as part of the area of the on-pixel storage capacitor electrode (e.g., without using additional processing steps and/or additional processing material/layers). As shown in some exemplary embodiments described herein, when the second electrode 1130 of the on-pixel storage capacitor is formed simultaneous as the other electrodes of the switching element 110 and the data line 160, the available area within a layer of the pixel is limited to less than pixel area $p^2$. In some exemplary pixels embodiments described above, an electrode area A of the on-pixel storage capacitor 130 cannot be larger than $p^2$ without additional layers that result in additional process steps and complications.

A fourth exemplary embodiment of a representative pixel can provide yet another high charge capacity pixel configuration/methods for making high charge capacity pixel configurations according to the present teachings. Pixel configurations according to the fourth exemplary embodiment, along with other variants, effectively can increase the electrode area A of an on-pixel charge storage element (e.g., capacitor) beyond the pixel dimensions or pixel area $p^2$. At the same time, the fourth exemplary embodiment of a representative pixel/methods according to the present teachings do not require additional processing steps, which are known to impact manufacturing cost and yield. The lack of additional processing steps (e.g., relative to a pixel without an on-pixel charge storage element), coupled with possible boost in pixel fill factor, can result in a pixel embodiments that offer high charge capacity and/or high efficiency.

FIGS. 29A-36A illustrates the top-down views of a fourth exemplary embodiment of a representative pixel 2900 at various fabrication stages, according to present teachings; FIGS. 29B-36B illustrates the cross-sectional views of the pixel 2900 that corresponds to FIGS. 29A-36A. The cutting-plane line D-D' for the cross-sectional views is shown in top-down view illustrations. It is noted that according to the present teachings, each layer discussed can be formed on, over, or proximate to the previously formed layers, directly or indirectly, respectively. For example, an insulating layer can comprise more than one insulator and a metal layer can comprise more than one metal. Additionally, other layers (not shown) can be formed between the layers illustrated in the figures that are not directly discussed, but are well known in semiconductor processing. The pixel 2900 can be used for the exemplary schematic circuit and the exemplary imaging array shown in FIGS. 7-8.

Pixel 2900 described in fourth exemplary embodiment of a representative pixel again can use a BCE a-Si:H TFT as the switching element 110 and an a-Si:H n-i-p photodiode as the photoelectric conversion element 120. However, the photoelectric conversion element 120 can be any one or combination of photoelectric photosensors or X-ray sensitive photosensors. Thus, for exemplary digital radiographic imaging systems using indirect X-ray detectors employing photoelectric conversion elements 120, an X-ray conversion screen, can be positioned in proximity to the photosensors and for direct X-ray detectors, X-ray sensitive photosensors, such as photoconductors can be used.

Figure 29A:
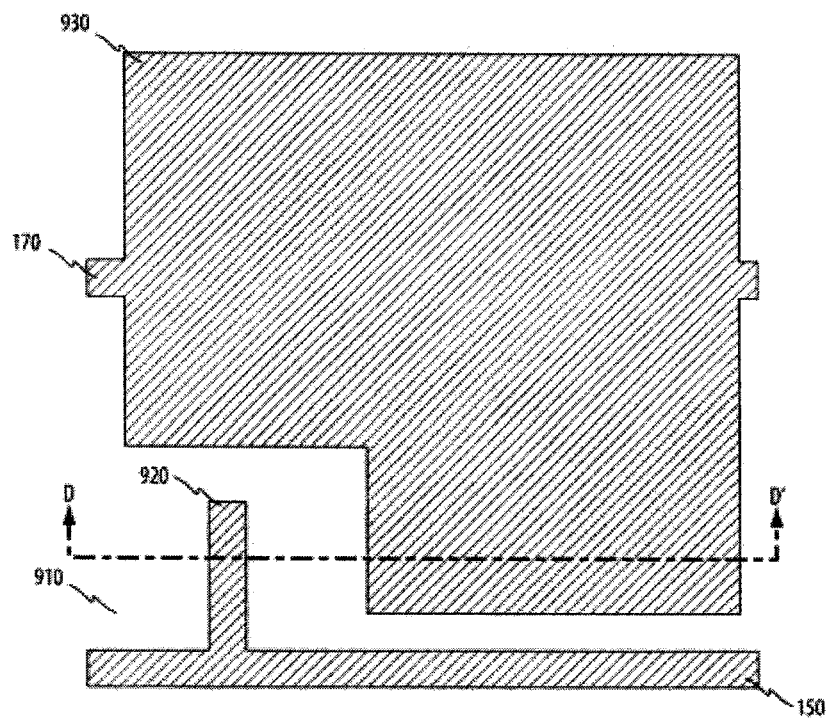
Figure 29B:
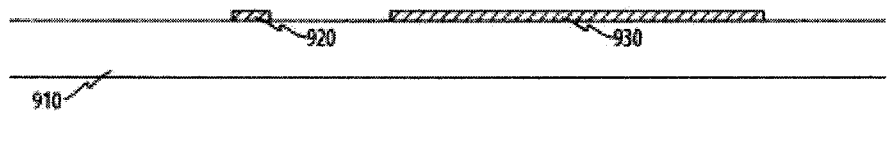

In FIG. 29A and FIG. 29B, the scan line 150, the bias line 170, the gate electrode 920, and the first electrode 930 of the on-pixel storage capacitor 130 can be formed over or proximate to the first surface of substrate 910. The scan line 150 and a region of the bias line 170 can be formed in the same metal layer. When the scan line 150 and portion of the bias line 170 are formed in the same metal layer, then the scan line 150 can be substantially parallel to a portion of the bias line 170, as shown in FIG. 29A. Further, the parallel configuration can also be present when the scan line 150 and the bias line 170 are not in the same metal layer. Alternatively, except for the configuration shown in FIG. 29A (e.g., formation in the same metal layer), the scan line 150 can instead be substantially transverse to a portion of the bias line 170 when formed in different metal layers. In some embodiments, the bias line 170 can also have portions that can be both parallel and transverse as is described in the FIG. 29A. In addition, portion(s) of the bias line 170 and the first electrode 930 can be between the first surface of substrate 910 and first terminal of the photoelectric conversion element 120 (not shown in FIG. 29A and FIG. 29B).

Figure 30A:
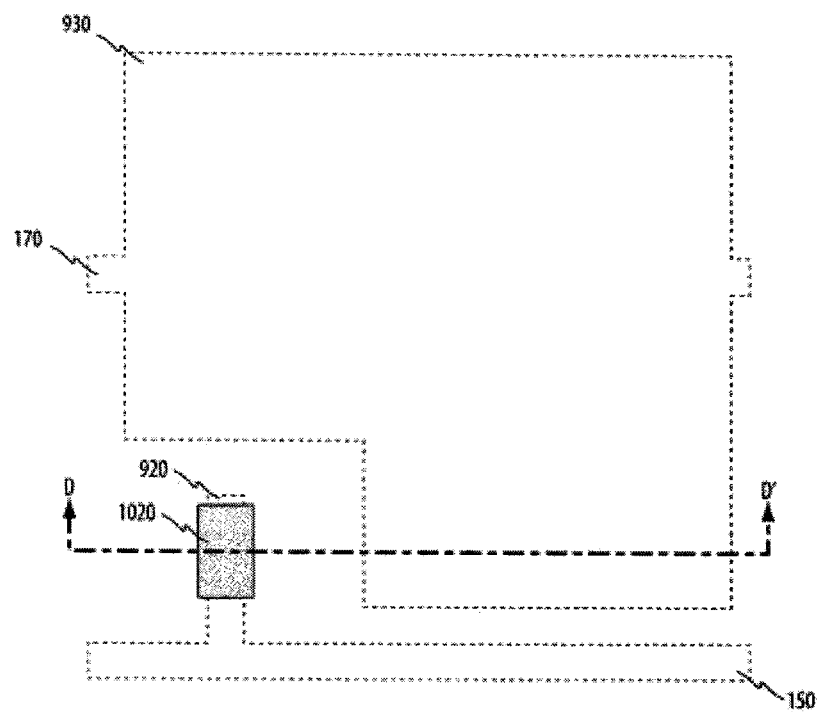
Figure 30B:
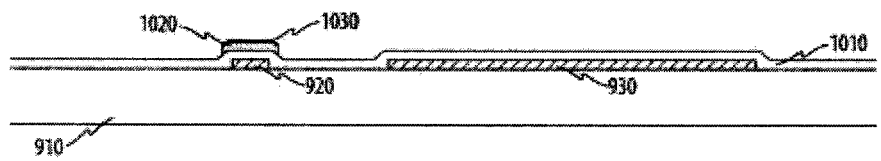

As shown in FIG. 30A and FIG. 30B, gate insulating layer 1010 for a TFT can be formed over or proximate to the entire surface of the substrate 910 including the scan line 150, the bias line 170, the gate electrode 920, and the first electrode 930 of the on-pixel storage capacitor (e.g. to cover the scan line 150, the bias line 170, the gate electrode 920, the first electrode 930 of the on-pixel storage capacitor, and any exposed surface of the substrate 910). Gate insulating layer 1010 can be a non-stoichiometric silicon nitride (a-SiN$_x$:H), or other types of insulating layers, e.g., oxides, etc. either single of stacked, as known in the art. An TFT active layer and doped contact layer can be formed over or proximate to the entire surface of the substrate 910 after the formation of the gate insulating layer 1010, e.g. PECVD of intrinsic and doped a-Si:H. The TFT active island 1020 can be formed by patterning the active layer and the doped contact layer island 1030 can be formed by patterning the doped contact layer (e.g. patterning by dry etching, etc.). In FIG. 30A, the doped contact layer island 1030 is omitted for clarity.

The deposition of these layers and patterning can be variously performed. For example, the gate insulator 1010, the active layer island 1020, and the doped contact layer island 1030, shown in FIG. 30B can be formed consecutively before patterning to form the active island.

As seen in FIG. 30A, an a-Si:H TFT as switching element 110 (not shown as completed) can be formed over a surface of substrate 910 where the active region of the a-Si:H TFT is over or proximate to the gate electrode 920. Alternatively, in some embodiments, the active region of the a-Si:H TFT can also be over or proximate to, and aligned with, the scan line 150. Additional alternative configurations of the switching element 110 are possible according to embodiments described herein. For example, portions of the scan line 150, as shown in FIG. 17, can be between the active island 1020 and the surface of the substrate 910, and can be considered as the TFT gate electrode 920.

Figure 31A:
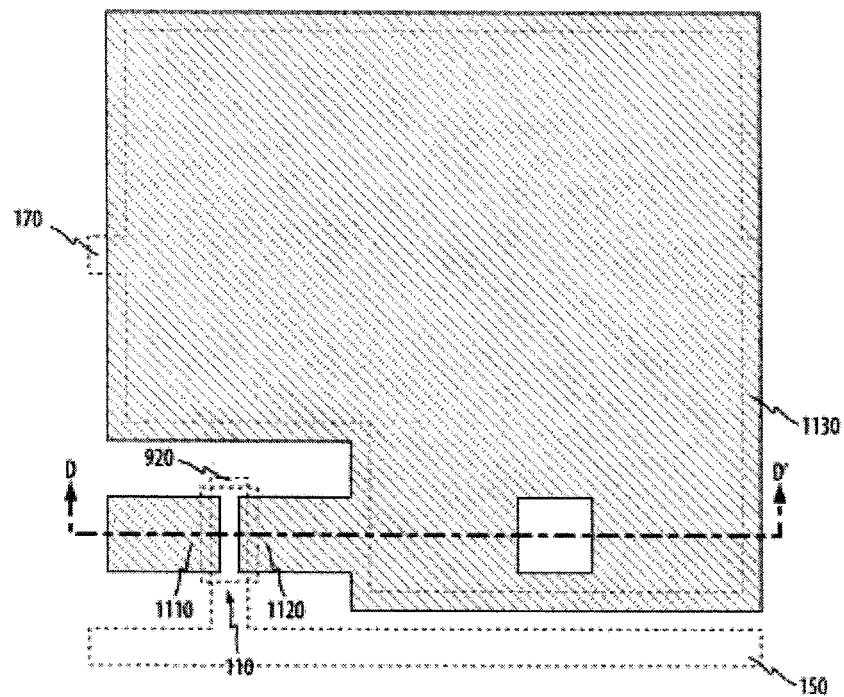
Figure 31B:
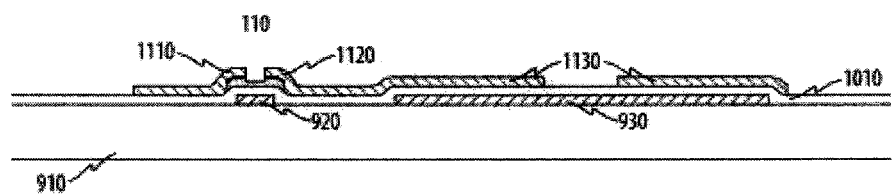

FIG. 31A and FIG. 31B illustrate exemplary formation of two terminals of the switching element TFT 110. As shown in FIG. 31A and FIG. 31B, the terminal 1120 can connect to photoelectric conversion element 120 (not shown), and the terminal 1110 can connect to data line 160 (not shown). Regions of the doped contact layer island 1030 between the two TFT terminals can be removed and portions of the active island 1020 can also be removed. Note here that the illustrations of the exemplary previous embodiments show that the data line 160 can be formed in this layer (e.g., metal layer) along with the electrodes of the TFT. As shown in FIG. 31A and FIG. 31B, the data line 160 is purposely shown formed in the top metal layer after the formation of the photodiode stack 1310 (not shown) to demonstrate that a number of alternated pixel configurations exist and can be implemented according to the present teachings. The second electrode 1110 of the on-pixel storage capacitor can also be formed in this layer. Further, the third electrode 1120 of the TFT and the second electrode 1130 of the on-pixel storage capacitor can be formed simultaneously and be electrically connected as shown in FIG. 31A and FIG. 31B. The gate electrode 920, the second electrode 1110 of the TFT, the third electrode 1120 of the TFT, and the active island can form the a-Si:H TFT as switching element 110 of sensor pixel 2900. It is noted that a region of the second electrode 1130 of the on-pixel storage capacitor can be removed as shown in FIG. 31A and FIG. 31B. This aperture opening can provide the electrical connection (e.g., space for a via) to electrically connect additional metal areas to effectively increase A. Operation of this exemplary region will be apparent with the formation of an electrode of the a-Si:H n-i-p photodiode as the photoelectric conversion element 120. Embodiments of the application can electrically connect additional metal areas using other connections such as but not limited to connections outside the pixel, vias, direct connection at an edge or corner of an electrode within the footprint of the electrode (e.g., to reduce edges and/or insulating layer requirements) or the footprint of the pixel. Further, more than one connection can be made to increase reliability or modify characteristics of the electrical coupling (e.g., decrease resistance).

Figure 32A:
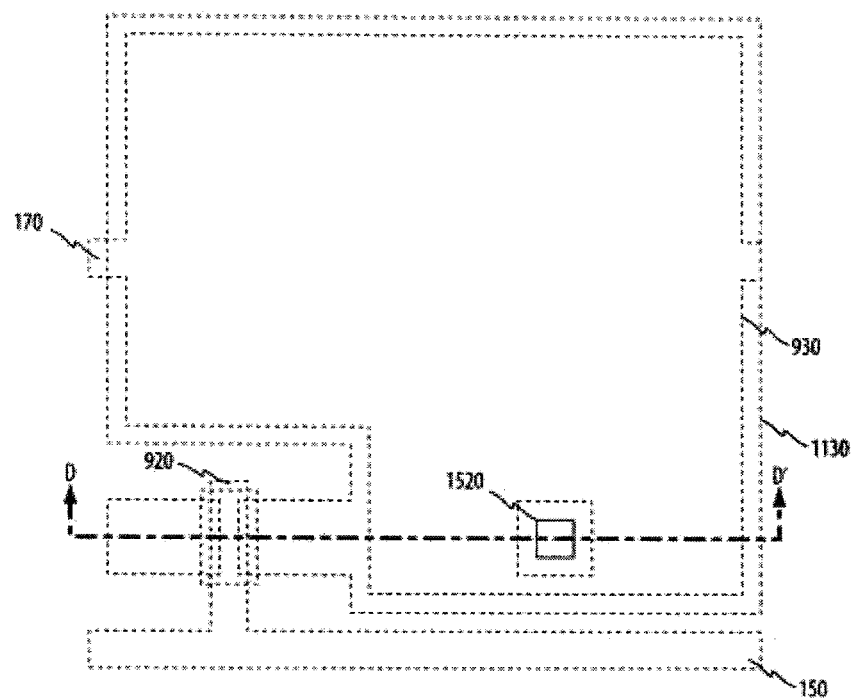
Figure 32B:
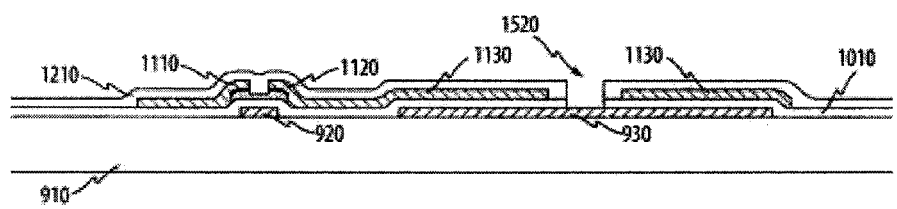

FIG. 32A and FIG. 32B illustrate exemplary formation of (e.g., TFT) passivation layer 1210 (e.g., over the entire surface of the previously formed features as shown). The passivation layer 1210 can be patterned to expose a portion of the first electrode 930 of the on-pixel storage capacitor. It is important to note that no regions of the second on-pixel storage capacitor electrode 1130 or the electrodes of the TFT (e.g., 1110 and 1120) are exposed. FIG. 32A and FIG. 32B show that an exemplary via window can be formed by removing portion of the gate insulating layer and the TFT passivation layer. The via window can operate as a bias line via window 1520 to electrically connect the photodiode bias electrode 1410 (not shown) to the bias line 170.

Figure 33A:
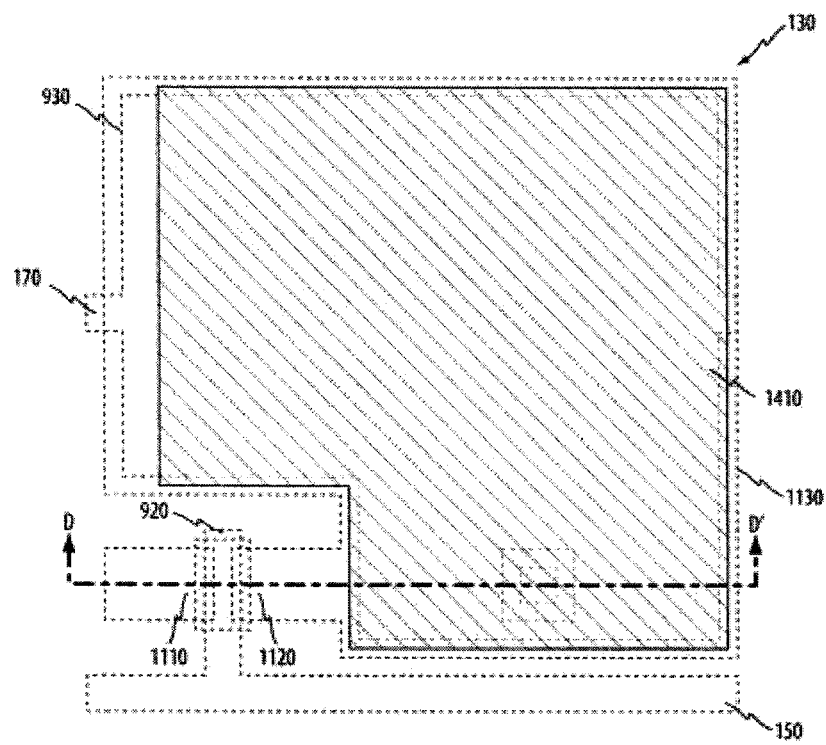
Figure 33B:
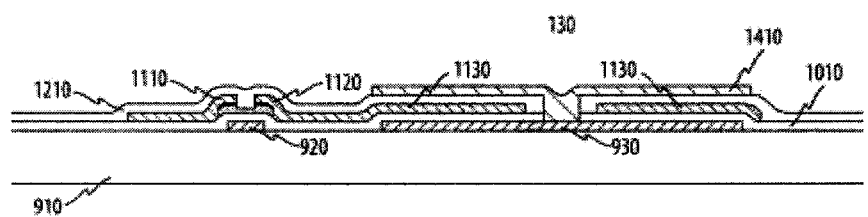

FIG. 33A and FIG. 33B illustrate exemplary formation of the photodiode bias electrode 1410. A metal layer can be formed over the entire surface of the previously formed features (e.g., covering the second on-pixel storage capacitor electrode 1130 and/or the bias line via window 1502). As shown in FIG. 33B, the patterned metal layer 1410 can be electrically connected to the first electrode 930 of the on-pixel storage capacitor. Consequently, the patterned metal layer 1410 can also serve as an electrode for the on-pixel storage capacitor 130. Since the first electrode 930 of the on-pixel storage capacitor can be electrically connected to the bias line 170 and the patterned metal layer 1410 can be electrically connected to the first electrode 930 of the on-pixel storage capacitor, the patterned metal layer 1410 effectively can serve as the photodiode bias electrode 1410. It is worth noting here that comparing to the previous exemplary embodiments, the photodiode bias electrode 1410 formation in FIG. 33A and FIG. 33B can be performed prior to the formation of the photodiode stack 1310. Also, in one embodiment, the bias line via window can be made small to allow more area for the second electrode 1130 of the on-pixel storage capacitor (and therefore higher $C_{st}$). Thus, as shown in FIG. 33A and FIG. 33B, the photodiode bias electrode can be made to approximately the same size as the photodiode stack 1310 (not shown).

One skilled in the art would readily recognize that the first electrode 930 of the on-pixel storage capacitor, the second electrode 1130 of the on-pixel storage capacitor, the photodiode bias electrode 1410, and the dielectric layers in between them, e.g. the gate insulating layer 1010 and the passivation layer 1210, can form the on-pixel storage capacitor 130. Referring to the equivalent schematic diagram of the pixel shown in FIG. 7, the bias line is electrically connected to the first electrode 930 of the on-pixel storage capacitor and the bias electrode of the photodiode; the second electrode 1130 of the on-pixel storage capacitor, the third electrode 1120 of TFT, the float node electrode 1810 of the photodiode (not shown in FIG. 33A and FIG. 33B), and associated connection metals is electrically connected and constitute the floating node 140. It is noted here that the desired $C_{st}$ can be achieved by varying any combination of the area of the electrodes (930, 1130, 1410) of the on-pixel storage capacitor 130, the thicknesses and material compositions of the dielectric layers, (1010, 1210) in between the electrodes. For example, when the photodiode bias electrode 1410 is made approximately the same size as the first electrode 930 of the on-pixel storage capacitor, the area of the electrode approximately doubles. In the case where both electrodes (930, 1130), electrically connected to the bias line, are made sufficiently large and closer to area $p^2$, the effective electrode area A gained by the on-pixel storage capacitor 130 doubles, closer to $2 \times p^2$. Accordingly, $C_{st}$ can be doubled from previous exemplary embodiments described herein using the same size of the first on-pixel storage capacitor electrode 930. For the configuration (e.g., square pixel) shown in FIG. 33A and FIG. 33B, A is larger than $p^2$ or A is larger than $1.5\ p^2$, which is not achievable with structures described in the previous exemplary embodiments without fabrication process changes.

Figure 37:
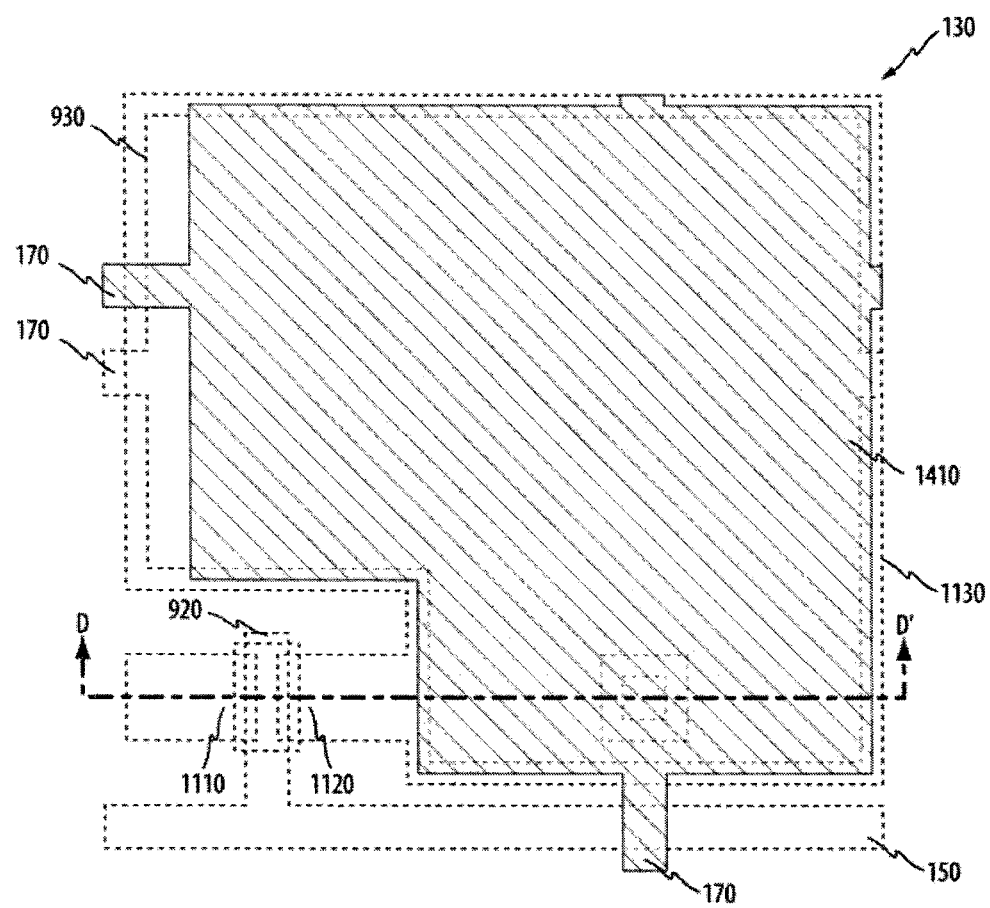
FIG. 37 is a diagram that illustrates a top-down view of an intermediate structure of an alternative exemplary pixel embodiment according to the present teachings.
Figure 38:
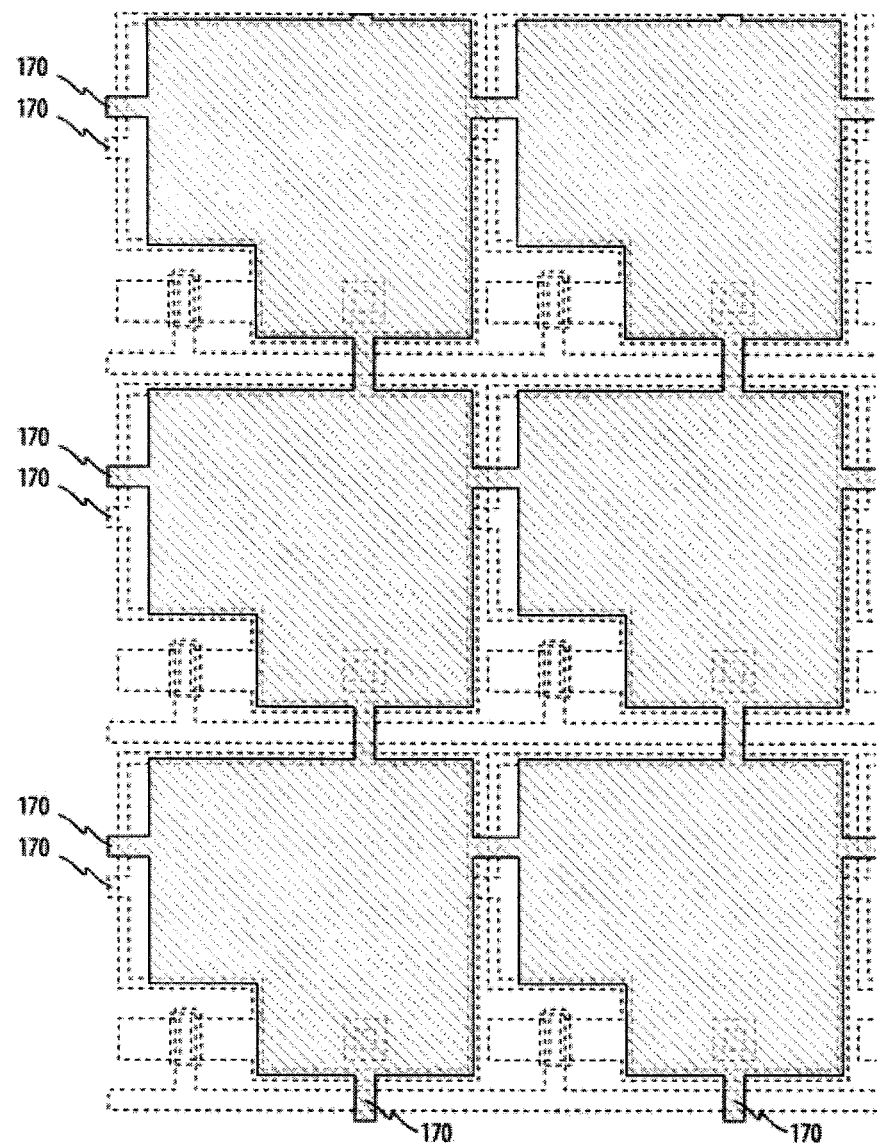
FIG. 38 is a diagram that illustrates a tiling of 3×3 incomplete pixels, according to FIG. 37, in an array matrix fashion, showing one exemplary bias line routing scheme.

Exemplary routing of the bias line 170 routing described so far was done in the first metal formation as shown in FIG. 29A, FIG. 29B. However, alternative routing can be accomplished according to embodiments of the application. For example, an alternative bias line 170 routing scheme can be achieved in alternative metal layers such as the bias electrode layer as illustrated in the top-down view shown in FIG. 37. The bias line routing 170 can be done in arbitrary directions in this metal with in the pixel 2900. As shown in FIG. 37, the bias line can be routed in directions both substantially perpendicular and transverse to the scan line 150. This portion of the bias line 170 routing, which can be in additional to or to replace the bias line 170 routing performed in the first metal formation (see FIG. 29A), can improve the manufacturing reliability of the bias line connections. To better illustrate one exemplary embodiment of this connectivity, a 3×3 tiling of the structure shown in FIG. 37 is shown in FIG. 38. Even if one connection bridge between the photodiode bias electrodes 1410 fails, e.g. at the center pixel, there are three other bridges that are connected to the same bias electrode 1410 of the center pixel. Further, the exemplary embodiment shown in FIG. 37 and FIG. 38 can be implemented again without additional processing steps (e.g., relative to a pixel without an on-pixel charge storage element).

Figure 34A:
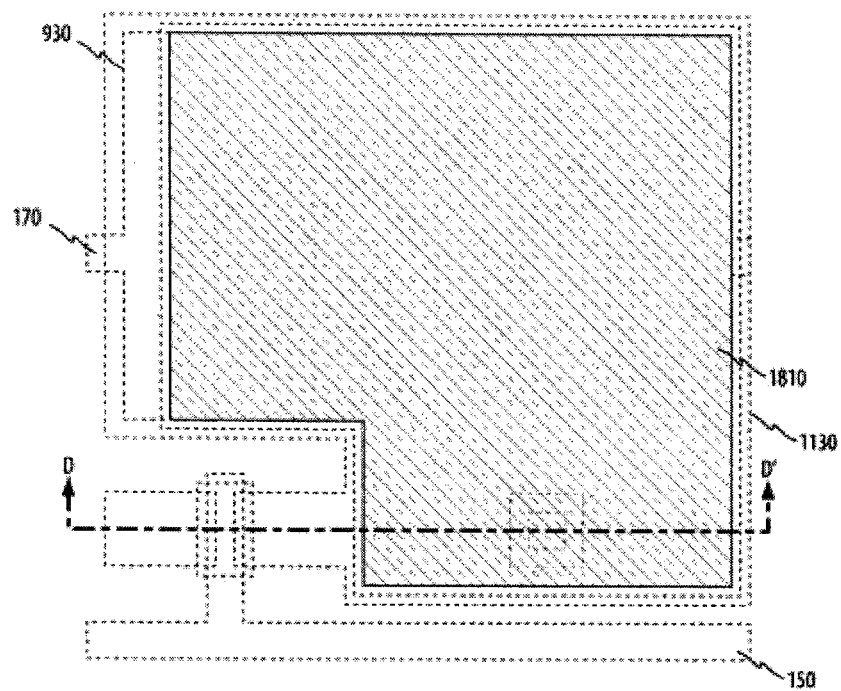
Figure 34B:
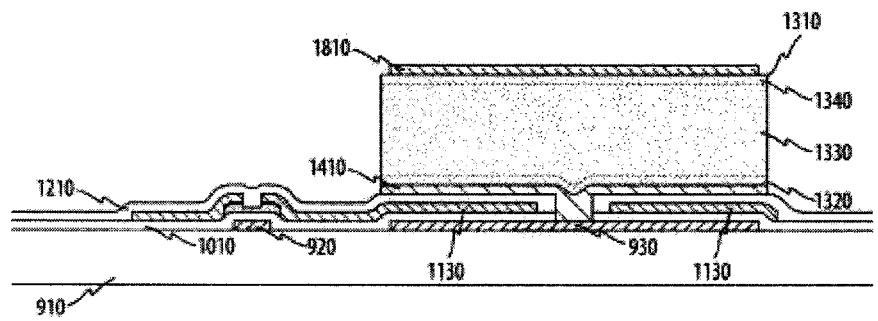

FIG. 34A and FIG. 34B illustrate exemplary formation of the a-Si:H n-i-p photodiode stack 1310 and exemplary floating node electrode 1810. The photodiode stack can include n-layer 1320, a relatively thick i-layer 1330, and a p-layer 1340. The three layers can be deposited in sequence, followed by a dry etch process to define the photodiode stack 1310 area. The photodiode stack 1310 layers can also be formed in reverse sequence to form p-i-n photodiode. The floating node electrode 1810 can then be formed approximately aligned to the photodiode stack 1310. The formation of the photodiode stack 1310 and the floating node electrode 1810 can also be done in a different sequence. For example, the layer of the photodiode stack 1310 and the photodiode floating node electrode 1810 can be deposited in sequence; however, the photodiode floating node electrode 1810 layer is patterned prior to the patterning of the photodiode stack 1310. Both sequences can result in the same structure shown in FIG. 34A and FIG. 34B.

It is also worth noting here that relative to previous embodiments, the floating node electrode 1810 is formed on top of the photodiode stack 1310 rather than the bottom. During operations of the pixel 2900, the floating node electrode 1810 is relatively closer to the majority of the incident photons than the photodiode bias electrode 1410. Therefore, whereas in the discussion of previous embodiments, the photodiode bias electrode 1410 can be made optically transparent, in this embodiment the floating node electrode 1810 can be made optically transparent using transparent conducting oxides (TCO), such as ITO.

Figure 35A:
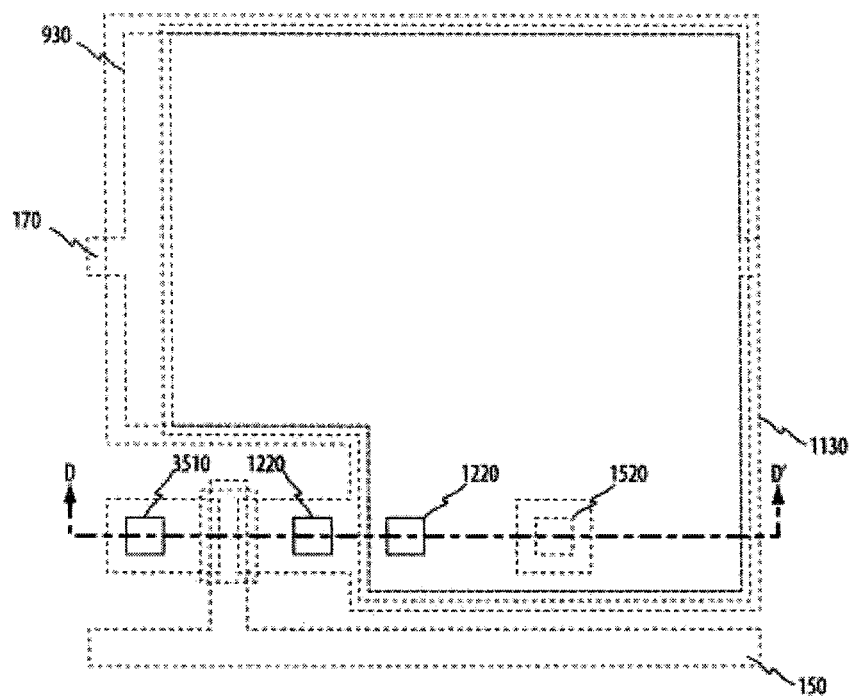
Figure 35B:
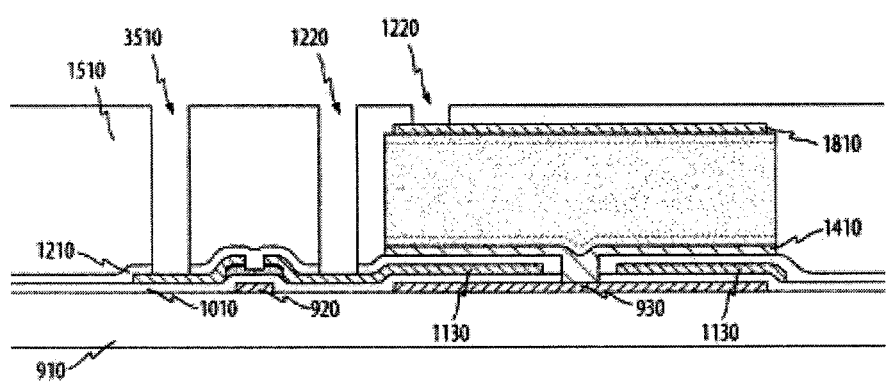

FIG. 35A and FIG. 35B illustrate exemplary formation of the as photoelectric conversion element 120 passivation layer 1510. The passivation layer 1510 layer can be formed over the surface of the previously formed features of pixel 2900. As shown in FIG. 35A and FIG. 35B, the floating node via window 1220 can be formed (e.g., dry etching or the like). Also shown in FIG. 35A and FIG. 35B, the data line via window 3510 can be formed (e.g., dry etching or the like). Further, both the floating node via window 1220 and the data line via window 3510 can be formed simultaneously or in sequence. The data line via window 3510 can be used when portions of the data line routing are achieved in metal layers formed after photodiode passivation layer 1510 such as where the via window 3510 can enable the electrical connection between the second electrode of the switching element TFT 1110 and the data line 160.

Figure 36A:
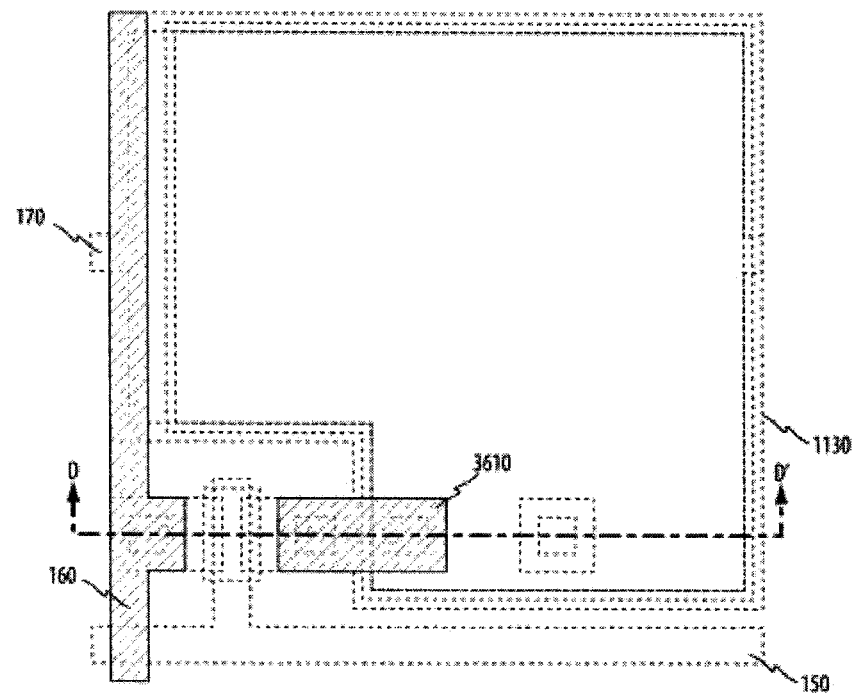
Figure 36B:
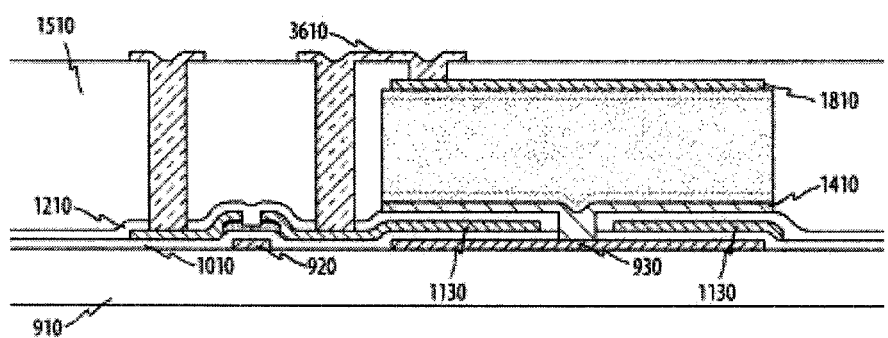

FIG. 36A and FIG. 36B illustrate exemplary formation of another metal layer to fill the previous via openings, including the floating node via window 1520 and the data line via window 3510. The metal layer can be patterned to form a portion of the data line 160. The metal layer can also be patterned to form a floating node connection metal 3610 to electrically connect the photodiode floating node electrode 1810 and the second electrode 1130 of the on-pixel storage capacitor. The portion of the data line 160 and the floating node connection metal 3610 can be formed simultaneously or in sequence. As shown in FIG. 36A and FIG. 36B, the second electrode 1130 of the on-pixel storage capacitor, the third electrode 1120 of TFT, the float node electrode 1810 of the photodiode, and the floating node connection metal 3610 can be electrically connected and constitute the floating node 140.

Pixel 2900 processing can continue with additional depositions and etchings, e.g., passivation, planarization, anti-reflection coating, forming periphery connections, etc. as well known in the art. It is noted that periphery connections can be formed during the above discussed process or after the forming of the pixels. In addition, as well be understood by one of ordinary skill in the art, additional layers of inorganic or organic dielectrics can be deposited and patterned for encapsulation and to improve optical performance of the formed imaging arrays. Additional layers of conductors can be deposited and patterned for imaging array pad bonding purposes.

According to exemplary embodiments pixel charge capacity can be increased by the addition of an on-pixel storage capacitor in which an electrode area of one or more electrodes of the on-pixel storage capacitor can pass beyond the constraint of the pixel dimensions or the pixel pitch (e.g., without additional fabrication steps from those to implement for a sensory array fabrication without the on-pixel storage capacitor). For example, embodiments of an on-pixel storage capacitor can be is formed in parallel with a TFT process (e.g., BCE, BCP); therefore, without any additional processing steps required while fabricating the sensor array. Thus, embodiments of pixels according to present teachings can boost pixel charge capacity without additional cost associated with extra masks or photolithography steps and/or no loss in yield caused by additional processing steps. Further, in exemplary pixel embodiments, an on-pixel storage capacitor is underneath a photoelectric conversion device (PECD), and bias line routing on top of the PECD can be reduced or removed, which can maintain or increase fill-factor of the pixel. In addition, exemplary pixel embodiments according to the present teachings can reduce or remove the requirement for additional ground routing lines for an on-pixel storage capacitor, which can improve manufacturing reliability and/or yield.

Further, additional layers of material, layers of metal, semiconductor layers, semiconductor devices and/or electronic devices can be form on or near a side of the substrate opposite from the pixel. In some embodiments, the substrate can comprise a flexible substrate as known to one skilled it the art. Thus, for example, a pixel 700 can be used with a flexible substrate. Further, substrates having embodiments of pixels and/or imaging devices formed thereon according to the application can be laminated together.

It should be noted that the present teachings are not intended to be limited in scope to the embodiments illustrated in the figures.

While the invention has been illustrated with respect to one or more implementations, alterations and/or modifications can be made to the illustrated examples without departing from the spirit and scope of the appended claims. For example, the various pixel embodiments can be used in radiation imaging systems. An example radiation imaging system can include a plurality of the various pixel embodiments in an array, driving circuits, readout circuits, and a phosphor screen. A radiation source can also be included.

In addition, while a particular feature of the invention have been disclosed with respect to only one of several implementations, such feature can be combined with one or more other features of the other implementations as can be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected.

Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed can be somewhat altered, as long as the alteration does not result in nonconformance of the process or structure to the illustrated embodiment. Also, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

We claim:

1. A pixel, comprising:
  a scan line proximate to a first surface of a substrate;
  a bias line between the first surface of the substrate and a first terminal of a photoelectric conversion element,
  a switching element proximate to the first surface of the substrate and aligned with at least a portion of the scan line, comprising:
    a first terminal;
    a second terminal; and
    a gate electrode electrically coupled to the scan line, wherein the first terminal of the switching element and the second terminal of the switching element are electrically coupled based on a scan signal from the scan line;
  the photoelectric conversion element proximate to the first surface of the substrate, comprising:
    the first terminal of the photoelectric conversion element electrically coupled to the bias line; and
    a second terminal of the photoelectric conversion element electrically coupled to the first terminal of the switching element; and
  a signal storage element proximate to the first surface of the substrate, comprising:
    a first terminal of the signal storage element electrically coupled to the bias line; and
    a second terminal of the signal storage element electrically coupled to the first terminal of the switching element and aligned with at least a portion of the photoelectric conversion element;
  a dielectric layer in proximate to the first terminal of the signal storage element and the second terminal of the signal storage element,
  where the scan line, the bias line and the gate electrode of the switching element are in a first metal layer proximate to the first surface of the substrate.

2. The pixel in claim 1, where the scan line, the bias line, the photoelectric conversion element and the switching element are formed in a prescribed number of metal layers and at least one dielectric layer, wherein the signal storage element is formed in the prescribed number of metal layers and the at least one dielectric layer.

3. The pixel in claim 1, wherein the bias line, the first terminal of the signal storage element, the scan line and the gate electrode are formed in a first metal layer, and
  wherein the second terminal of the switching element, a data line, the second terminal of the signal storage element and the first terminal of the switching element are formed in a second metal layer.

4. The pixel in claim 1, where additional layer or layers of materials are formed proximate to a second surface of the substrate, wherein the second terminal of the signal storage element is also the second terminal of the photoelectric conversion element.

5. The pixel in claim 1, wherein an area of the first terminal of the signal storage element and an area of the second terminal of the signal storage element is approximately the same.

6. The pixel in claim 1, wherein an area of one of the terminals of the signal storage element is larger than the square of the pixel pitch or wherein an area of the first terminal of the signal storage element is at least double an area of the second terminal of the signal storage element, wherein said one of the terminals of the signal storage element comprises two separate metal layers.

7. The pixel in claim 1, wherein the dielectric layer of the signal storage element exists between the second terminal of the signal storage element and the first terminal of the photoelectric conversion element.

8. The pixel in claim 1, wherein the first terminal of the photoelectric conversion element is electrically connected to the first terminal of the signal storage element, wherein the electrical connection is a direct connection inside or outside the pixel.

9. The pixel in claim 1, wherein one or both terminals of the signal storage element have open apertures.

10. The pixel in claim 1, wherein the first terminal of the photoelectric conversion element and the bias line is formed in the same metal layer.

11. The pixel in claim 1, wherein the dielectric layer of the signal storage element comprises multiple layers of material, comprises silicon nitride, comprises two layers of silicon nitride, and wherein one or more terminals of the photoelectric conversion element is optically transparent or translucent.

12. The pixel in claim 1, wherein a portion of the photoelectric conversion element is proximate to at least one of a portion of the scan line, a portion of a data line, a portion of the first terminal of the charge storage element, a portion of the second terminal of the charge storage element, and a combination thereof.

13. The pixel in claim 1, wherein at least a portion of the bias line is wider than the scan line.

14. A radiation imaging system comprising:
  at least one imaging array comprising:
    a plurality of pixels according to claim 1 that are electrically connected in rows and columns, wherein the scan line and the bias line are common to more than one pixel, wherein the bias line is connected to a subset of pixels in at least two rows and one column or the bias line is connected to a second subset of pixels in at least two columns and one row,
driving circuits, and
readout circuits;
a radiation source for generating the first radiation; and
a conversion screen configured to convert first radiation of one or multiple wavelength range into second radiation of one or multiple different wavelength range proximate to the plurality of pixels.

15. The pixel in claim 1, wherein the photoelectric conversion element is selected from the group of n-i-p photodiodes, p-n junction photodiodes, MIS photosensors, and phototransistors,
wherein the switching element is selected from the group of MOS thin-film-transistors, junction field-effect-transistors, fully-depleted SOI transistors, partially-depleted SOI transistors, SiOG transistors, bulk MOS transistors, and bi-polar transistors,
wherein the photoelectric conversion element includes at least one semiconductor layer, and the at least one semiconducting layer is selected from the group of amorphous silicon, micro crystalline silicon, poly-crystalline silicon, single-crystal silicon, organic semiconductor, and metal oxide semiconductors,
wherein the switching element includes at least one semiconductor layer, and the at least one semiconducting layer is selected from the group of amorphous silicon, micro crystalline silicon, poly-crystalline silicon, single-crystal silicon, organic semiconductor, and metal oxide semiconductors,
wherein the signal storage element includes at least one dielectric layer selected from the group of amorphous silicon, silicon nitride, micro crystalline silicon, poly-crystalline silicon, single-crystal silicon, organic semiconductor, and metal oxide semiconductors, or wherein the signal storage element includes at least one semiconductor layer, and the at least one semiconducting layer is selected from the group of amorphous silicon, micro crystalline silicon, poly-crystalline silicon, single-crystal silicon, organic semiconductor, and metal oxide semiconductors.

16. The pixel in claim 1, further comprising additional metal layers between the bias line and the photoelectric conversion element,
wherein the first terminal of the photoelectric conversion element is a cathode and the second terminal of the photoelectric conversion element is an anode, or wherein the first terminal of the photoelectric conversion element is an anode and the second terminal of the photoelectric conversion element is a cathode.

17. The pixel of claim 1, wherein the bias line is substantially parallel to the scan line, or wherein the bias line is substantially transverse to a portion of the scan line.

18. A method of forming a digital radiographic detector including an indirect imaging pixel array, the method comprising:
providing a substrate for the indirect imaging pixel array;
forming a scan line, a bias line and a control electrode of a switching element in a first metal layer proximate to a first surface of the substrate;
forming a first insulating dielectric layer over the scan line, the control electrode of the switching element and the bias line;
forming an island area over at least a portion of the control electrode, the island area comprising a semiconductor layer;
forming a second terminal of the switching element, a data line connected to the second terminal of the switching element, a first terminal of the switching element, and a second terminal of a photoelectric conversion device connected to the first terminal of the switching element in a second metal layer proximate to the first surface of the substrate, wherein the first terminal and the second terminal of the switching element are electrically coupled based on a scan signal from the scan line;
forming a second insulating dielectric layer over the first terminal of the switching element, the data line and the second terminal of the switching element, wherein the second terminal of the photoelectric conversion device is exposed in the second insulating dielectric layer;
forming a photoelectric conversion layer stack over the second terminal of the photoelectric conversion element and a first terminal of the photoelectric conversion element over the photoelectric conversion layer stack in a third metal layer; and
electrically connecting the first terminal of the photoelectric conversion element to the bias line,
wherein the forming a scan line through electrically connecting steps form a signal storage element proximate to the first surface of the substrate, comprising:
a first terminal electrically coupled to the bias line; and
a second terminal electrically coupled to the first terminal of the switching element;
a dielectric layer proximate to the first terminal and the second terminal of the signal storage element.

19. The method of claim 18, wherein the first metal layer, the second metal layer, the third metal layer and the first insulating dielectric layer comprise the first terminal, the second terminal and the dielectric layer of the signal storage element, wherein an area of one terminal of the signal storage element is larger than an area of a pixel.

20. A pixel, comprising:
a scan line proximate to a first surface of a substrate;
a bias line between the first surface of the substrate and a first terminal of a photoelectric conversion element,
a switching element proximate to the first surface of the substrate and aligned with at least a portion of the scan line, comprising:
a first terminal;
a second terminal; and
a gate electrode electrically coupled to the scan line, wherein the first terminal of the switching element and the second terminal of the switching element are electrically coupled based on a scan signal from the scan line;
the photoelectric conversion element proximate to the first surface of the substrate, comprising:
the first terminal of the photoelectric conversion element electrically coupled to the bias line; and
a second terminal of the photoelectric conversion element electrically coupled to the first terminal of the switching element; and
a signal storage element proximate to the first surface of the substrate, comprising:
a first terminal of the signal storage element electrically coupled to the bias line; and
a second terminal of the signal storage element electrically coupled to the first terminal of the switching element and aligned with at least a portion of the photoelectric conversion element;

a dielectric layer in proximate to the first terminal of the signal storage element and the second terminal of the signal storage element, where an effective surface area of the signal storage element per pixel is greater that a surface area of one pixel.

* * * * *